United States Patent
Gilbert et al.

[19]

[11] Patent Number: 5,805,861
[45] Date of Patent: Sep. 8, 1998

[54] METHOD OF STABILIZING COMPONENT AND NET NAMES OF INTEGRATED CIRCUITS IN ELECTRONIC DESIGN AUTOMATION SYSTEMS

[75] Inventors: Douglas J. Gilbert, Anoka; James E. Rezek, Mounds View, both of Minn.; Harold E. Reindel, Essex Junction, Vt.; Allen B. A. Tabbert, Bloomington, Minn.

[73] Assignee: Unisys Corporation, Blue Bell, Pa.

[21] Appl. No.: 524,017

[22] Filed: Aug. 29, 1995

[51] Int. Cl.⁶ .................................................. H02L 21/70
[52] U.S. Cl. ......................... 395/500; 364/488; 364/489
[58] Field of Search ........................ 395/500; 364/488, 364/489, 490, 491, 578

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 5,050,091 | 9/1991 | Rubin | 364/488 |
| 5,150,308 | 9/1992 | Hooper et al. | 364/489 |
| 5,164,908 | 11/1992 | Igarashi | 364/491 |
| 5,175,696 | 12/1992 | Hooper et al. | 364/489 |
| 5,222,029 | 6/1993 | Hooper et al. | 364/489 |
| 5,243,538 | 9/1993 | Okuzawa et al. | 364/489 |
| 5,267,175 | 11/1993 | Hooper | 364/489 |
| 5,341,309 | 8/1994 | Kawata | 364/489 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,398,195 | 3/1995 | Kim | 364/491 |
| 5,406,497 | 4/1995 | Altheimer et al. | 364/489 |
| 5,416,721 | 5/1995 | Nishiyama et al. | 364/491 |
| 5,418,733 | 5/1995 | Kamijima | 364/490 |
| 5,450,331 | 9/1995 | Lin et al. | 364/490 |
| 5,452,226 | 9/1995 | Hooper et al. | 364/489 |

OTHER PUBLICATIONS

Bapat et al., SHARP–Looking Geometric Partitioning, IEEE pp. 172–176, Feb. 1991.

*Primary Examiner*—Kevin J. Teska
*Assistant Examiner*—Matthew Clay Loppnow
*Attorney, Agent, or Firm*—Charles A. Johnson; Mark T. Starr

[57] ABSTRACT

A method used by an electronic design automation system for stabilizing the names of components and nets of an integrated circuit from one design version to another. A previous integrated circuit design version and a current integrated circuit design version are partitioned into multiple cones of logic design. Each cone of logic design is defined by a path from a logic designer-defined apex net to a logic designer-defined base net affecting the apex net. Selected cones of logic design are compared. If the selected cones have identical logical structure, the component and net names of the previous integrated circuit design version are transferred to the current integrated circuit design version. If the selected cones of logic design do not have identical structure, then the component and net names for subsections of the selected cones of logic design that do have identical logical structure are transferred to the current integrated circuit design version, and new component and net names are assigned to those subsections of the selected cones of logic design from the current integrated circuit design version which did not exist in the previous integrated circuit design version.

9 Claims, 20 Drawing Sheets

A = (OROF) (ANDOF) (OROF B, C)
(OROF D, E)
(ANDOF) (OROF F, G)
(OROF H, J)

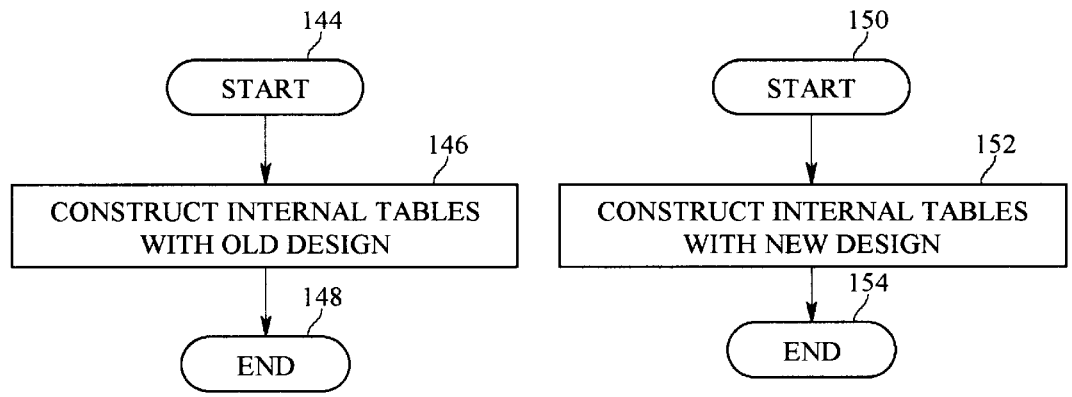
FIG. 9A  FIG. 9B
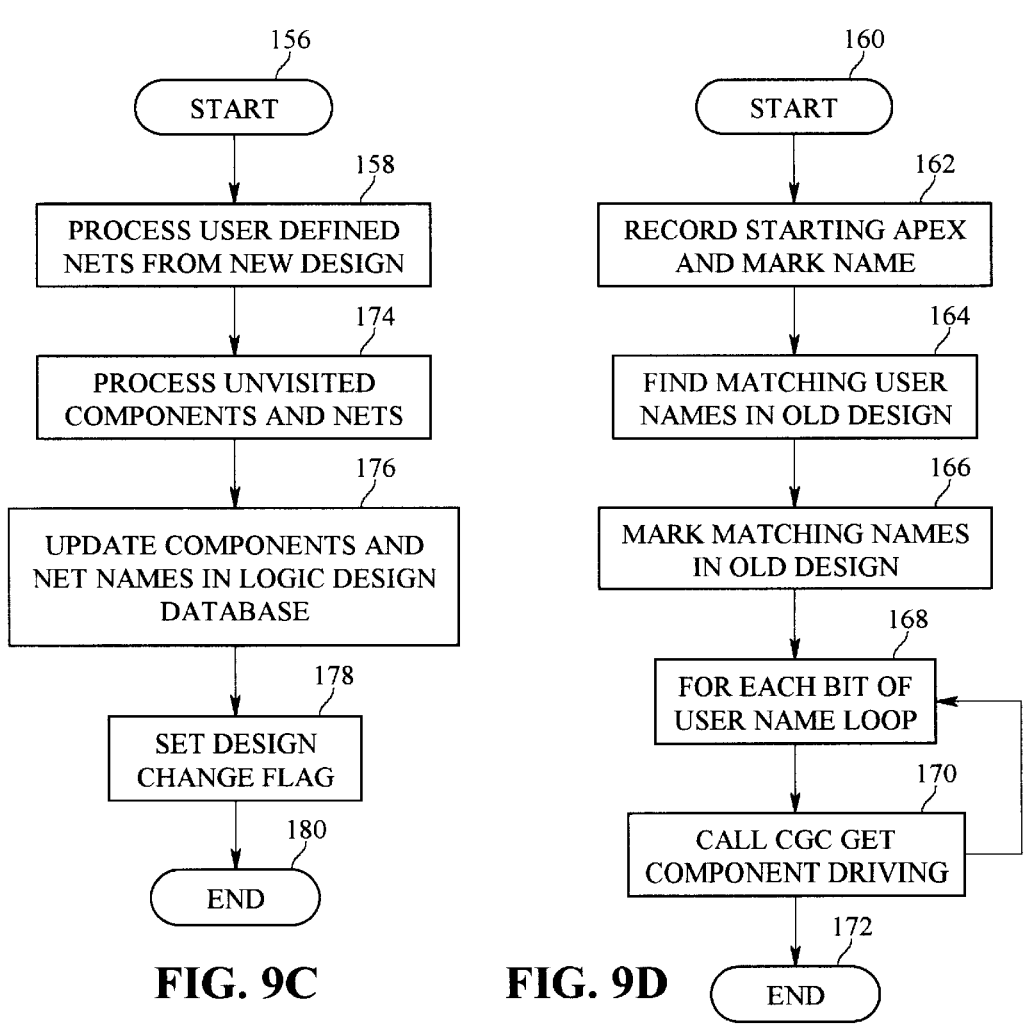
FIG. 9C  FIG. 9D

| | NEW USER COMP | NEW "Z" COMP | NEW "Q" COMP | NO NEW COMP |
|---|---|---|---|---|
| OLD USER COMP | NC, CT, NA / SC, CT, NA | | | |
| OLD "Z" COMP | SC, CT, NA | NC, CT, NA / SC, DT, NA | SC, CT, PN | SC, DT, NA |
| OLD "Q" COMP | SC, CT, NA | SC, DT, NA | NC, CT, RN / SC, CT, PN | SC, DT, NA |
| NO OLD COMP | SC, CT, NA | SC, DT, NA | SC, CT, PN | |

FIG. 12

| ╳ | NEW USER NET | NEW "Z" NET | NEW "Q" NET | NO NEW NET |
|---|---|---|---|---|
| OLD USER NET | NC, DT, NA | SC, DT, NA | SC, CT, PN | SC, DT, NA |
| OLD "Z" NET | SC, DT, NA | NC, CT, NA | NC, CT, RN | |
| OLD "Q" NET | SC, DT, NA | SC, DT, NA | SC, CT, PN | SC, DT, NA |
| NO OLD NET | SC, DT, NA | SC, DT, NA | SC, CT, PN | |

FIG. 15

METHOD OF STABILIZING COMPONENT AND NET NAMES OF INTEGRATED CIRCUITS IN ELECTRONIC DESIGN AUTOMATION SYSTEMS

BACKGROUND OF THE INVENTION

1. Field of the Invention

This invention relates generally to electronic design automation (EDA) systems used for designing integrated circuits. The invention is more specifically related to a method of maintaining consistency of logical component and net names used in EDA synthesis and logic optimizing tools during the integrated circuit design process.

2. Background Information

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specially developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a standard cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip. A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy will be a single block that defines the entire design, and the bottom layer of the hierarchy will consist of leaf cells, the cells (i.e., the logical components) that were originally provided in the cell library. Note that the hierarchy is typically structured as a special kind of a graph called a tree. This resulting data structure is called a detailed (or gate-level) description of the logic design.

The generation of the detailed description is accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer removes logic from the design that is unnecessary. However, this action affects the component and net names generated by the logic synthesis tool.

It is also necessary to verify that the logic definition is correct and that the integrated circuit implements the function expected by the circuit designer. This verification is currently achieved by estimated timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements. As a result of each revision to the design, the logic design synthesis-generated component and net names may completely change. Thus, the EDA tools downstream in the design process from the logic design synthesis software must be re-executed on the entire design.

After timing verifications and functional simulation has been completed on the design, placement and routing of the design's components is performed. These steps involve allocating components of the design to locations on the integrated circuit chip and interconnecting the components to form nets. Finally, final timing verification is performed after placement and routing is complete.

A major problem that arises during the design process described above is that the complex gate-level names generated by the logic design synthesis software may change during each iteration of the design process because of modifications to the integrated circuit design. Even a minimal change at critical points in the integrated circuit design may cause the logic design synthesis tools to generate completely new names for substantially all of the design. As a result, other EDA tools such as the logic optimizing, placement, and routing tools must be re-executed on the entire design, rather than on only the portions or modules of the design that have been changed. Since many of the steps in the design process are iterative, such small changes in the behavior description of the design, usually made as a result of finding errors during timing verification and simulation, cause large amounts of processing time to be used for re-executing the optimizing, placement, and routing tools on the entire design. In many cases, the number of design iterations may be hundreds of times through the design and test cycle. One skilled in the art can readily see that this situation causes a substantial increase in the time needed for integrated circuits to be designed and tested. For current integrated circuit designs having hundreds of thousands of gates, this situation is unacceptable. The elimination of this name inconsistency problem for electronic design automation tools used in the integrated circuit design process is one of the goals of the present invention.

An EDA process that also minimizes the number of iterations needed to arrive at an acceptable design solution would be a valuable advance in the state of the art. The desired method would allow a circuit designer to converge on a good design solution in fewer iterations of the design cycle than under previous methods. Existing methods always operate on an entire circuit design, thereby resulting in placement modifications and changes in timing characteristics. In extreme cases, the circuit designer may go through many design iterations, fixing new design problems arising from each iteration without converging on an acceptable solution. A better approach is to use component name consistency to ensure that only those portions of the circuit design which have truly changed in the current design iteration are revisited by placement, routing, and timing analysis tools. This approach would leave acceptable portions of the circuit design in a fixed state, thus allowing the designer to concentrate on finalizing the design for the remaining portions of the integrated circuit design. In this regard, the present invention provides advantages over the prior art.

SUMMARY OF THE INVENTION

An object of this invention is to shorten the integrated circuit design and test cycle.

Another object of this invention is to decrease the time required for using electronic design automation (EDA) systems in the integrated circuit design and test cycle.

Yet another object of this invention is to decrease the number of design iterations required for a circuit designer to converge to an acceptable design solution.

A further object of this invention is to maintain component and net name consistency in electronic design automation tools for unchanged portions of an integrated circuit design during multiple iterations of the design and test cycle.

Yet another object of this invention is to modify the output of logic design synthesis tools to stabilize synthesis-generated component and net names so that other EDA tools, such as logic optimizing, placement, and routing tools, may be operated on only those portions of the integrated circuit design that have actually changed during the current design iteration, thereby minimizing EDA system processing time.

A still further object of this invention is to eliminate processing time spent on re-compiling the logic design synthesis software-generated gate-level description for modules of an integrated circuit design that have not been modified during the current design iteration.

Another object of this invention is to maintain name consistency for components and nets in an integrated circuit design during multiple iterations of the design and test cycle so as to retain physical attributes of the design assigned by EDA placement and routing tools.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended Claims.

According to the present invention, the foregoing and other objects and advantages are attained by a novel method for stabilizing the use of logical names in the gate-level description of an integrated circuit design by logic optimizing, placement, and routing tools in an electronic design automation system. The electronic design automation system for designing an integrated circuit includes a register transfer level description of the integrated circuit design as specified by a circuit designer through the use of a design capture program. The register transfer level description references logical names for the integrated circuit's components and nets. A logic design synthesis program takes as input the register transfer level description and generates a gate level description of the integrated circuit design. The gate level description references gate level names for the integrated circuit's components and nets. Nets of the circuit which are inputs are called base nets; nets of the circuit which are outputs are called apex nets. The gate level description is stored in a design database. The gate level description is input to other EDA tools such as logic optimizers, placement tools, and routing tools.

The method of stabilizing component and net names from a previous circuit design version to a current circuit design version includes the steps of partitioning the previous circuit design version and the current circuit design version into "cones" of logic design. A cone is a section of the circuit design defined by a path from at least one logic designer-defined apex net to at least one logic designer-defined base net affecting the apex net. Corresponding cones of logic design are selected from the previous circuit design version and the current circuit design version. If the selected cones of logic design have identical logical structure (that is, a portion of logic in the previous circuit design version was carried forward unchanged to the current circuit design version), then the component and net names of the selected cone of logic design in the previous circuit design version are transferred to the current circuit design version. If the selected cones of logic design do not have identical logical structure (that is, the logic designer has modified some portion of the logic in going from the previous circuit design version to the current circuit design version), then component and net names from all subsections of the selected cone of logic design from the previous circuit design version which have identical logical structure to corresponding sections of the selected cone of logic design from the current circuit design version are transferred to the current circuit design version, and new component and net names are assigned for those subsections of the selected cone of logic design from the current circuit design version that do not exist in the selected cone of logic design from the previous circuit design version. The selection and transfer steps are repeated for all cones of logic design in the circuit design versions.

Still other objects and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended Claims.

BRIEF DESCRIPTION OF THE DRAWINGS

FIG. 9A is a flow chart illustrating the steps of the Cone Graph Compare Old Design Read process.

FIG. 9B is a flow chart illustrating the steps of the Cone Graph Compare New Design Read process.

FIG. 9C is a flow chart illustrating the steps of the Cone Graph Compare process.

FIG. 9D is a flow chart illustrating the steps for processing user-defined nets.

FIG. 12 is a diagram showing the Component Action Table.

FIG. 15 is a diagram showing the Net Action Table.

DESCRIPTION OF THE PREFERRED EMBODIMENT

Figures 1A, 1B:
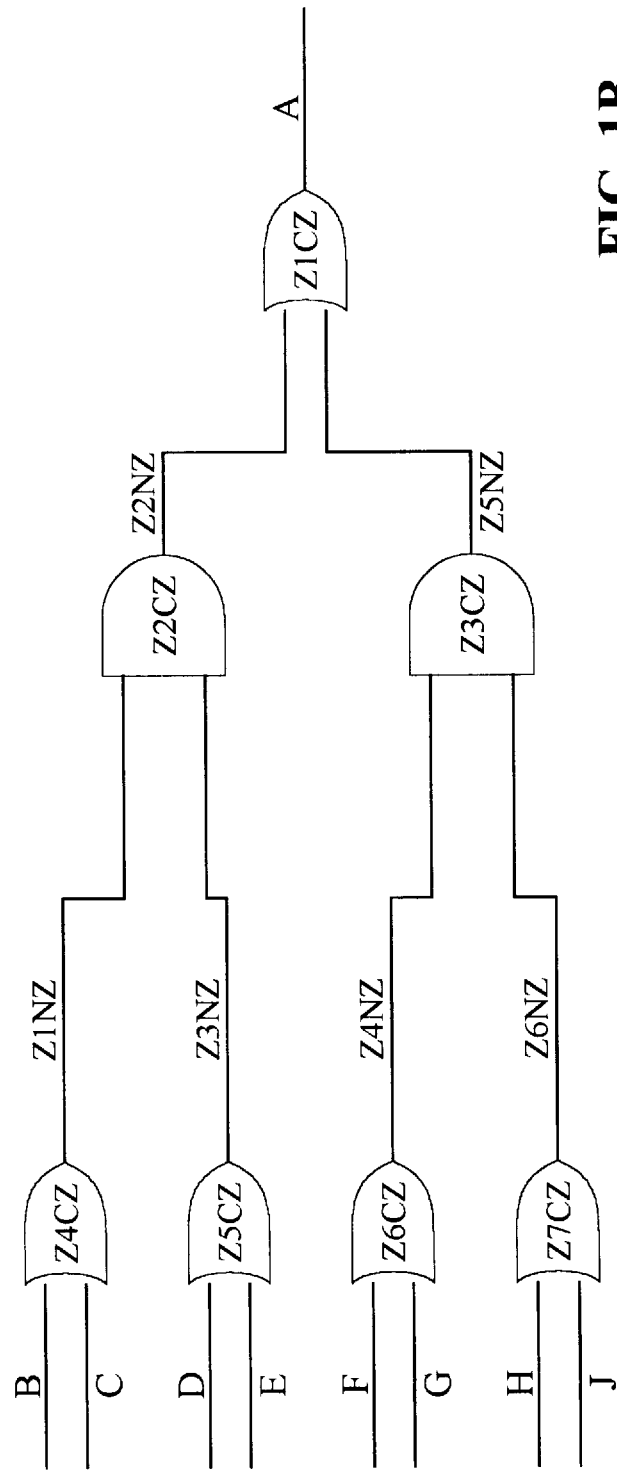
FIG. 1A is an example of a behavioral description of logic in an integrated circuit.
FIG. 1B is a gate-level representation synthesized from the behavior description shown in FIG. 1A.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floor plan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via a software tool), while other attributes are generated by the EDA software system. Names of components and nets are one of the main software-generated attributes.

An integrated circuit designer makes changes to the behavior description for a variety of reasons. These changes require steps in the design process to be performed again. Iterations through the synthesis process cause different name attribute values to be assigned. Being able to maintain component and net name consistency from one design version to another minimizes the amount of effort required to return the design to a known state. A static state is the state the design was in prior to a logical behavioral change.

Physical attribute values, especially component placement and interconnect routing coordinates, are contingent upon a name-based design. In other words, each attribute and its value is associated with a given name and the object the name represents. For the physical floorplanning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process is usually a manual and automated process implemented by the circuit designer and EDA software.

FIG. 1A is an example of a behavior description of logic for an integrated circuit. In this simple example, the signal named "A" is generated by a combination of "AND" and "OR" logical functions. The input signals are provided by "B", "C", "D", "E", "F", "G", "H", and "J". This behavior description is then input to a logic design synthesis tool to produce a gate-level description. FIG. 1B is a gate-level representation synthesized from the behavior description shown in FIG. 1A. The user-defined names "A", "B", "C", "D", "E", "F", "G", "H", and "J" are shown as input and output lines for the circuit. The logic design synthesis tool has generated multiple "AND" and "OR" gates to implement the behavior description. These gates, and the interconnections between them, are given names by the logic design synthesis tool. In the example shown in FIG. 1B, all synthesis-generated names start with the letter "Z".

As discussed above, current logic design synthesis tools read a behavior description and transform that description into a detailed description. During the transformation process, the majority of components and nets are automatically generated by the logic design synthesis software. During the component and net generation process, the logic design synthesis tool will assign a unique name to each synthesis-generated component and net (i.e., those components and nets not explicitly defined by the circuit designer). Generally, the circuit designer has the ability to specify some minimal set of names within the behavior description. A fundamental problem with synthesis tools is their inability to recognize design changes from one design version to another. Thus, for every pass that the synthesis process is activated, a new unique name is generated for each component and net generated by the logic design synthesis tool.

Figure 2:
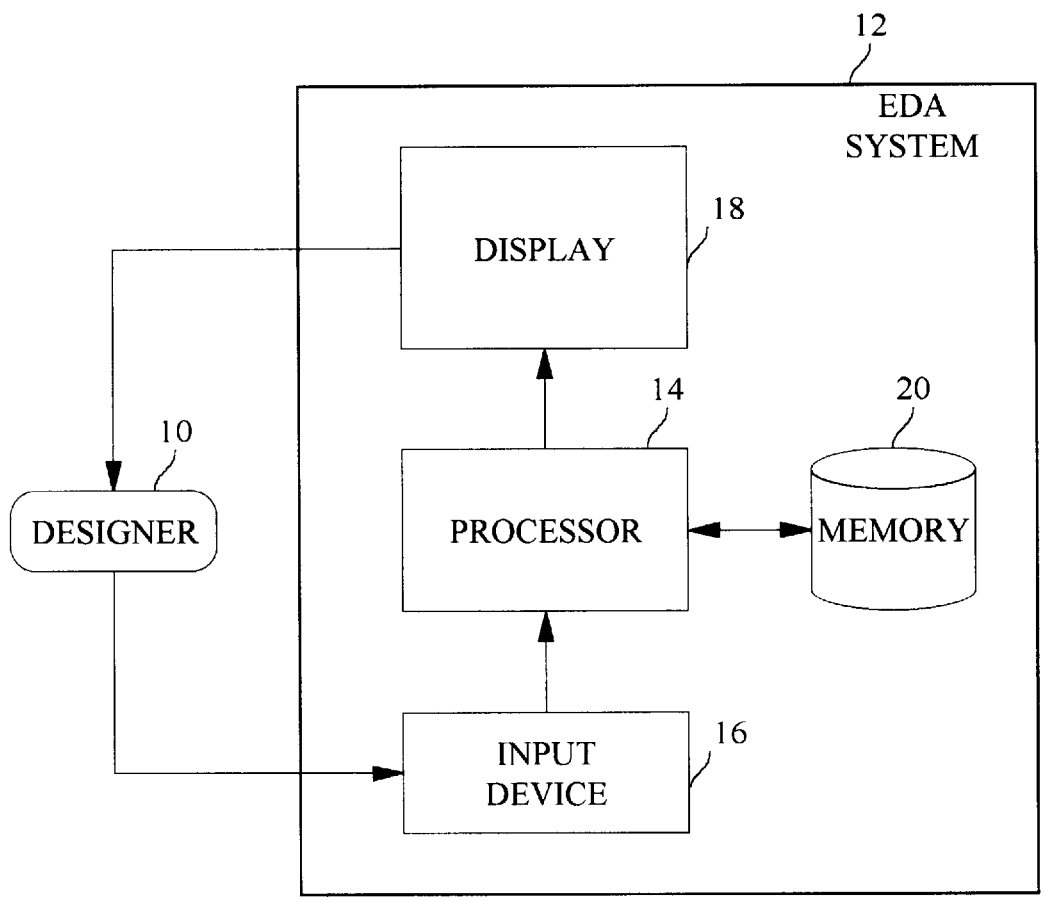
FIG. 2 is a block diagram of the computer-based environment of the present invention.

FIG. 2 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc., may also be used. The Designer 10 enters design information into the EDA System by using a well-known Input Device 16 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to the logic design in Memory 20. The Memory may take the form of a semiconductor memory, magnetic disks, optical disks, magnetic tape or other mass storage device.

Figure 3:
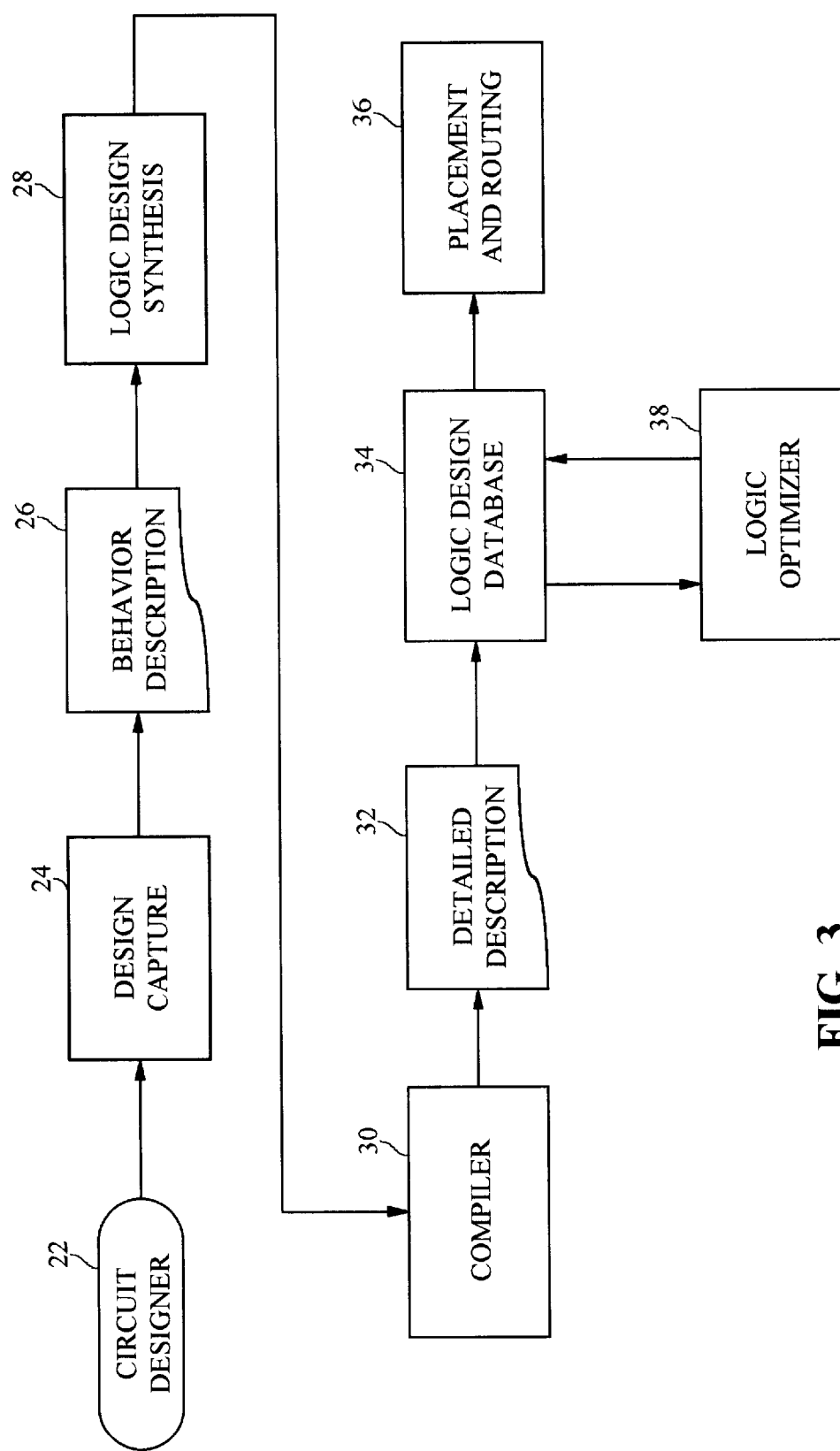
FIG. 3 is a block diagram of the process environment of the present invention.

FIG. 3 is a block diagram of the process environment of the present invention. The Circuit Designer 22 specifies the logic design of an integrated circuit by using Design Capture software 24. In the preferred embodiment, the Hardware Computer-Aided Design System (HCADS), available from Unisys Corporation, is used as Design Capture software 24, although other design capture programs from companies such as Cadence Design Systems, Inc., Synopsys, Inc., and Mentor Graphics, Inc., are also commercially available. At a minimum, when using a hardware description language, any text editor program may be used to specify the design.

The result of this activity is a Behavior Description file 26. The Behavior Description represents the logic design as specified at the register transfer level. Items in the Behavior Description file map to functional components of the design. In the preferred embodiment, the Behavior Description is written in a design language called Universal Design Source Language (UDSL), which is proprietary to Unisys Corporation, although other existing, well-known hardware design languages could also be used. The Behavior Description is input to Logic Design Synthesis software 28. Logic Design Synthesis software 28 creates the gates and other circuitry needed to implement the design specified by the Behavior Description. In the preferred embodiment, the Synthesis software comprises the Behavior to Structure Translator (BEST) synthesis tool developed by Unisys Corporation. However, alternate embodiments such as the VHDL Design Compiler commercially available from Synopsys, Inc., the DesignBook synthesis tool from Escalade, and the Synergy synthesis tool available from Cadence Design Systems, Inc., may also be used. The Logic Design Synthesis software 28 works in conjunction with Compiler 30 to generate the Detailed Description file 32. This file contains the gate-level definition of the logic design. The Compiler translates the textual language representation into the binary database representation. The Detailed Description file 32 is in Prime Behavior Description Language (('BDL), a Unisys Corporation proprietary language) format.

The Detailed Description file 32 is input to a variety of other EDA software programs, only some of which are shown in FIG. 3. The Detailed Description 32 is sometimes referred to as the netlist for the design. The Detailed Description is stored in a Logic Design Database 34. The Logic Design Database is used as input to a variety of other EDA programs such as Placement and Routing software tools 36, as well as Logic Optimizer software 38. In the preferred embodiment, the Placement and Routing tools 36 are systems commercially available from Cadence Design Systems, Inc., although other firms active in the electronic design automation (EDA) industry all sell systems similar in function to the above mentioned Cadence tool. In the preferred embodiment, the Logic Optimizer is the Design Compiler, commercially available from Synopsys, Inc.

The Logic Optimizer reads and writes Electronic Data Interchange Format (EDIF) files. The EDIF format is an industry standard format for hardware design language information. Embedded within the Logic Design Database 34 is an EDIF reader (not shown) and an EDIF writer (not shown). The EDIF writer and reader translate the internal Logic Design Database formatted data files to and from EDIF format.

Figure 4:
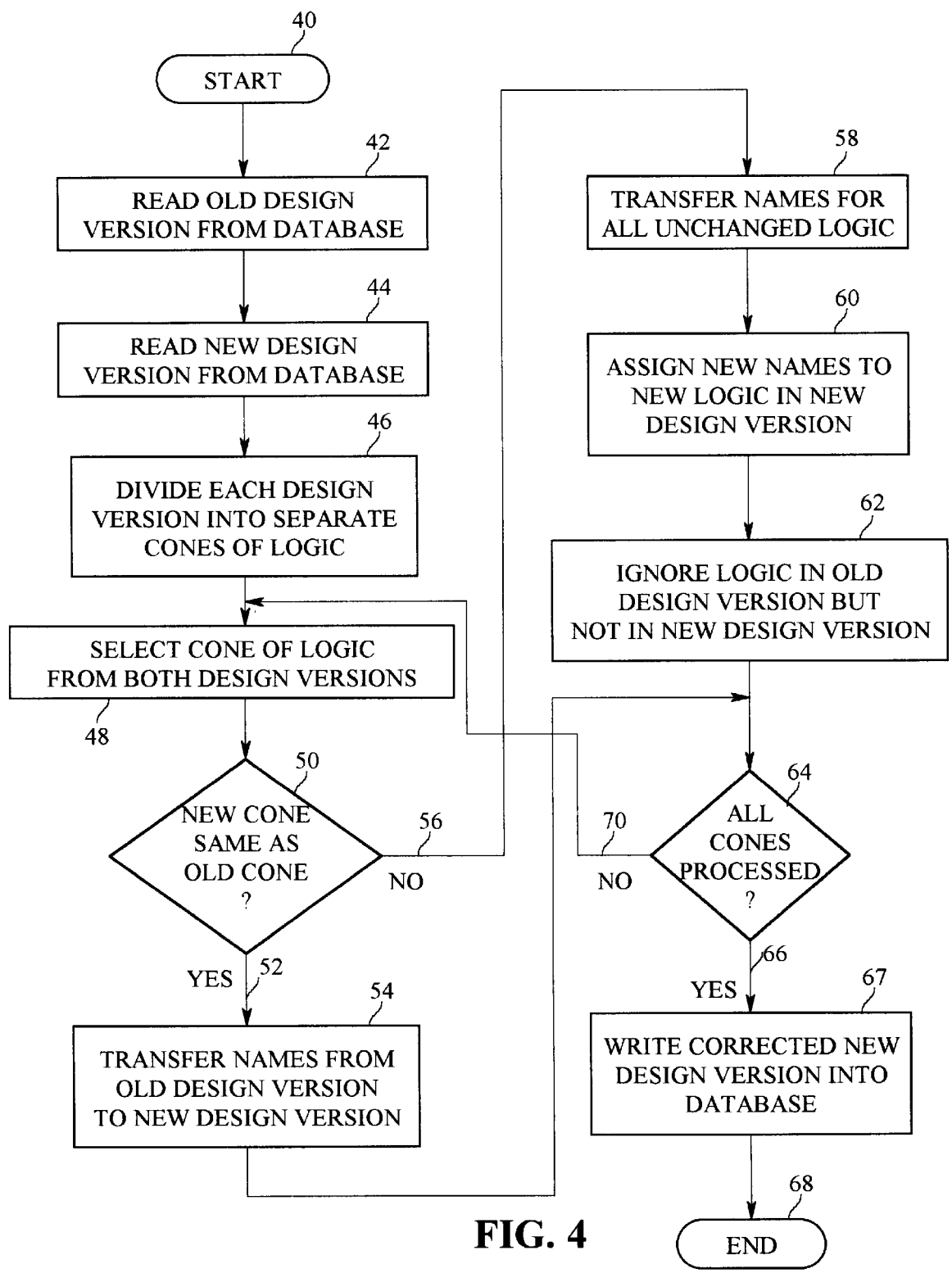
FIG. 4 is a flow chart illustrating the high level steps of Cone Graph Compare processing.

The present invention encompasses a concept called Cone Graph Compare (CGC) processing. This concept was developed to correct the deficiencies resulting from the use of the Logic Design Synthesis and Optimization tools. Cone Graph Compare processing transfers component and net names from a previous version of a design onto a current version of the design, whenever it is applicable. FIG. 4 is a flow chart illustrating the high level steps of Cone Graph Compare processing. After Start Step 40, CGC processing reads the old (previous) design version from the Logic Design Database at Step 42. At Step 44, the new (current) design version is read from the Logic Design Database. At Step 46, each design version (new and old) is partitioned into separate "cones" of logic. A cone of logic is defined as a section of a logical description bounded by a group of user-defined net names (source and destination). More specifically, a cone is defined as a path from a given user net (apex) back to a user net (base) affecting the apex. At Step 48, CGC processing selects a common cone of logic from both design versions by means of locating identical source and destination net names. CGC processing always works from a user apex to a user base; it never "backs up."

Cone Graph Compare processing deals with two cases of the design, based on cones of logic. The two cases are a normal case and a delta case. The normal case occurs when the cone of logic is identical from one design version to the other. The delta case occurs when the cone of logic is not identical from one design version to the other. In the description detailed below, any reference dealing with a comparison, name change, etc. to logic implies reference to a cone of logic (that is, a user-defined destination traced back to the user-defined source).

At Test Step 50, the new cone of logic is compared to the corresponding old cone of logic. If the cones are identical in structure, then Yes path 52 is taken to Step 54. CGC handles the normal case by transferring the component and net names from the previous design version to the current design version at Step 54. To accomplish this, CGC traces the cone of logic of both design versions from the destination net to the source net and transfers the component and net names from the old (previous) version to the new (current) version during the tracing algorithm. Processing then continues at Test Step 64.

If the cones of logic are not identical in structure, No path 56 is taken to Step 58. CGC handles the delta case in several steps. The first step, at Step 58, is to transfer the names from the previous design version to the current design version, for all logic that has not changed. The second step, at Step 60, is to assign new names to the new design version for any new logic identified. The third step, at Step 62, is to ignore the logic in the old design version which was not found in the new design version. If all cones of logic in the design versions have been processed (Test Step 64), then Yes path 66 is taken to Step 67. If more cones of logic in the design versions need to be processed, No path 70 is taken back to Step 48, for selection of a new cone of logic to process. At Step 67, the corrected new design version is written to the Logic Design Database. Processing ends at End Step 68.

A standard naming convention for component and net names is employed throughout the tools of the EDA System to facilitate CGC processing. All tools which generate component and net names conform to the system standard. User-defined names cannot end with either "Q" or "E". Component and net names automatically generated by the EDA System tools end in "Q" or "Z". Names automatically generated by the Compiler 30 end in "CQ" and names automatically generated by the Logic Optimizer 38 end in "Q". Net names start with "N". CGC processing changes alls "Q" names to "Z" names for storage in the Logic Design Database 34. Thus, a "CQ" name is translated into a "CZ" name, and a "Q" name or "N" name is translated into a "Z" name. "Z" component and net names are not considered to be user-defined names. Only "Q" and "N" names are changed by CGC processing. Once a name is assigned, it is never reassigned during a single invocation of CGC processing and is also never re-used for subsequent revisions of the design being compared. While this naming convention is used in the preferered embodiment, it should be understood that any appropriate naming convention could be used to all CGC processing to recognize the designer-entered names, the newly generated names, and previous CGC generated names.

There are many functional requirements and features of Cone Graph Compare (CGC) processing. The comparison function is limited by module boundaries, wherein a module is a particular portion of the integrated circuit logic design hierarchy. The comparison is done on all modules within a given hierarchy, one module at a time. Module input and output nets (i.e., nets connected to module input or output terminals) are always user-defined names; they are never automatically generated names. In the present system, there are no pass-throughs. A user-defined net cannot directly connect a module input to a module output. Current and new module data structures are saved by CGC processing and a list of nets is also maintained.

CGC processing reads and updates a cone of logic for the new logic design based on compared results against a cone of logic for the current logic design. All user-defined names are retained by CGC processing. The component and net names of the new logic design are modified to match the current logic design names when the cone of logic of the new logic has not changed. New component and net names are generated for the new logic design for those cones of logic where a topological comparison difference occurred from the current level to the new level of the logic design. Bit ranges and stack indices are not changed by CGC processing.

Figure 5:
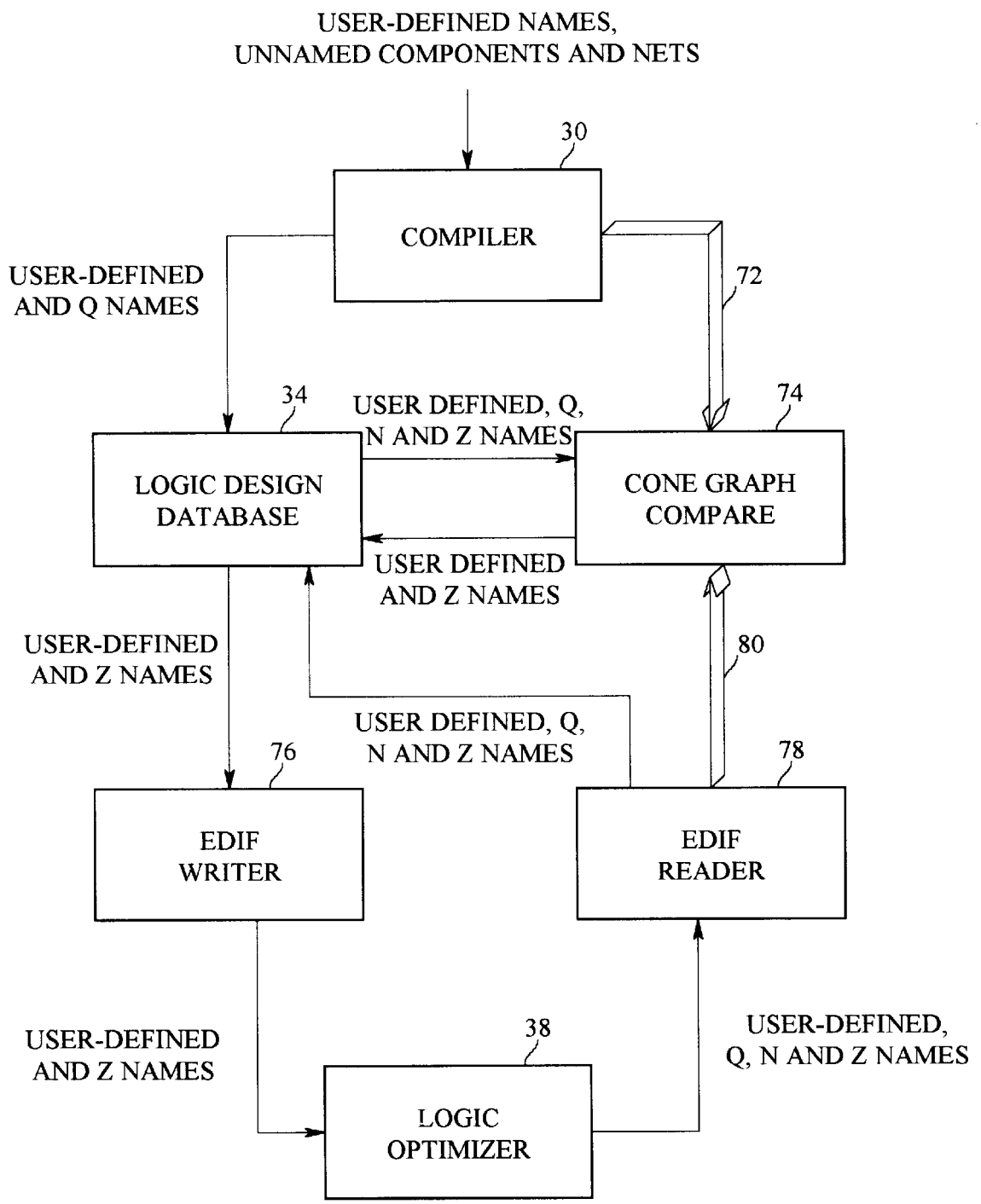
FIG. 5 is a diagram illustrating the Cone Graph Compare module and other EDA processing modules and the data flows between them.

FIG. 5 is a diagram illustrating the Cone Graph Compare and other EDA processing modules and the data flows between them. The Compiler 30 takes user-defined names and unnamed components and nets as input data. It generates "Q" names as discussed above and stores both the user-defined names and the "Q" names in the Logic Design Database 34. The data stored in the Logic Design Database comprises the Detailed Description 32 from FIG. 3. The Compiler 30 makes a procedure call (depicted as Flow 72) to the Cone Graph Compare (CGC) processing module 74 to translate the "Q" names. CGC processing 74 reads the user-defined names and "Q" names from the Logic Design Database 34 and translates them to user-defined names and "Z" names. It also does a comparison of the old and new names. The resulting user-defined names and "Z" names are stored back into the Logic Design Database 34. The user-defined names and the "Z" names are sent to EDIF Writer 76. The EDIF Writer 76 module translates the user-defined names and "Z" names for the logic design from the Logic Design database format into the EDIF format. This step is necessary in the preferred embodiment because the Logic Optimizer 38 only reads and writes EDIF formatted files. In alternate embodiments, the EDIF Writer 76 and EDIF Reader 78 may not be required. During Logic Optimizer processing, some logic may be deleted from the design and some logic may be added to the design. The Logic Optimizer outputs the new logic design containing user-defined names, "Q" names, "N" names, and "Z" names. The newly assigned components have names with a "Q" suffix and the newly assigned net names have a prefix "N" following by one or more numerals.

EDIF Reader 78 converts the EDIF formatted names back into the database format for storage in the Logic Design Database 34. EDIF Reader stores user-defined names, "Q" names, "N" names, and "Z" names into the database. EDIF Reader 78 also calls Cone Graph Compare 74 processing (represented as Flow 80) to again translate the newly generated "Q" and "N" names into "Z" names.

Figure 6:
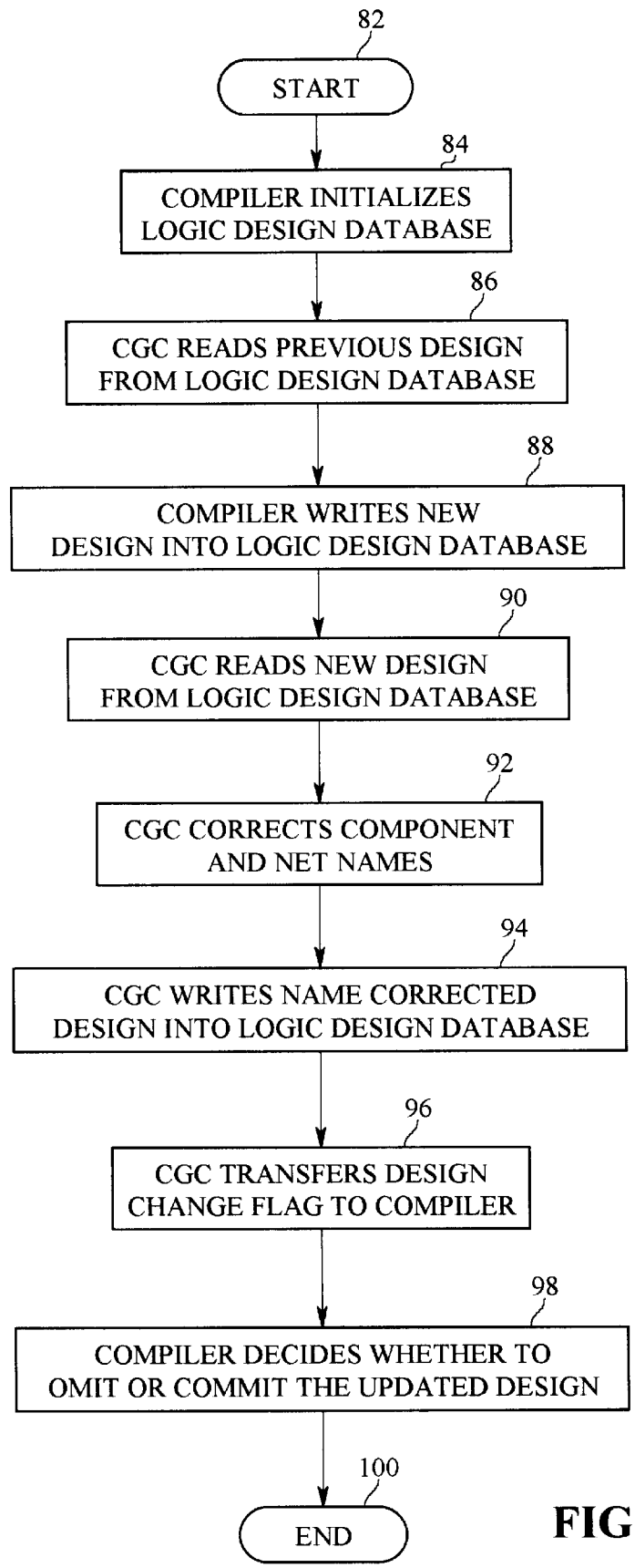
FIG. 6 is a flow chart illustrating the steps of Cone Graph Compare processing when the Compiler calls the Cone Graph Compare module.

FIG. 6 is a flow chart illustrating the steps of Cone Graph Compare processing when the Compiler calls the Cone Graph Compare module. After Start Step 82, the Compiler 30 initializes the Logic Design Database 34 (see FIG. 5) at Step 84. The Cone Graph Compare module reads the previous design (i.e., the "old" design) from the Logic Design Database at Step 86 and builds a memory data structure. Next, at Step 88 the Compiler writes the new design into the Logic Design Database 34. At Step 90, the CGC module 74 reads the new design from the Logic Design Database. The CGC module then corrects the component and net names at Step 92 by analyzing the cones of logic contained in the design, comparing the old and new designs and assigning new names as needed. At Step 94, the CGC module writes the name corrected design into the Logic Design Database. The CGC module then transfers the design change flag to the Compiler at Step 96. The design change flag indicates the condition where the new logic is different than the old logic. At Step 98, the Compiler decides whether to omit or commit the updated (new) design. If the design change flag is set, then the changes to the new design are accepted. Processing ends at End Step 100.

Figure 7:
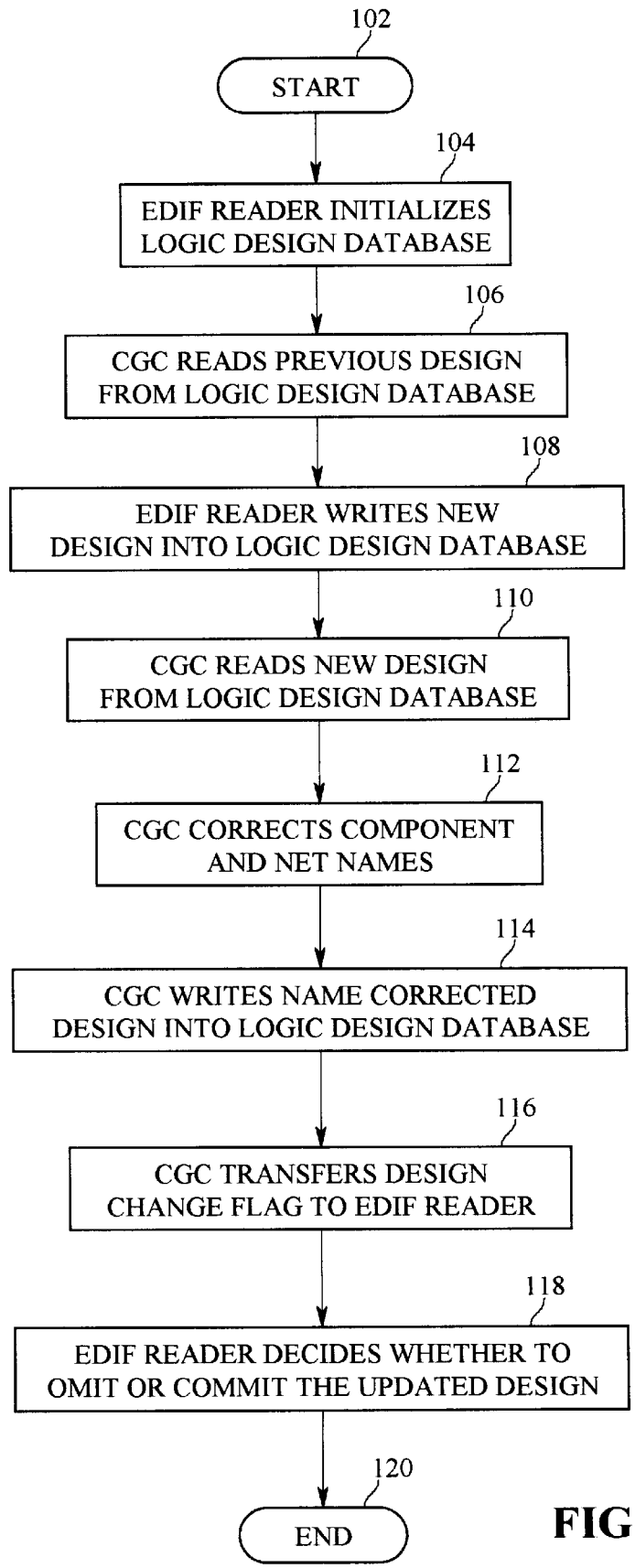
FIG. 7 is a flow chart illustrating the steps of Cone Graph Compare processing when the EDIF Reader calls the Cone Graph Compare module.

FIG. 7 is a flow chart illustrating the steps of Cone Graph Compare processing when the EDIF Reader calls the Cone Graph Compare module. Processing is similar to when the Compiler calls the Cone Graph Compare module. After Start Step 102, the EDIF Reader 78 initializes the Logic Design Database 34 at Step 104. The Cone Graph Compare module reads the previous design (i.e., the "old" design) from the Logic Design Database at Step 106. Next, at Step 108 the EDIF Reader writes the new design into the Logic Design Database 34. At Step 110, the CGC module 74 reads the new design from the Logic Design Database. The CGC module then corrects the component and net names at Step 112 by analyzing the cones of logic contained in the design, comparing the old and new designs, and assigning new names as needed. At Step 114, the CGC module writes the name corrected design into the Logic Design Database. The CGC module then transfers the design change flag to the EDIF Reader at Step 116. At Step 118, the EDIF Reader decides whether to omit or commit the updated (new) design. If the design change flag is set, then the changes to the new design are accepted. Processing ends at End Step 120.

Figure 8:
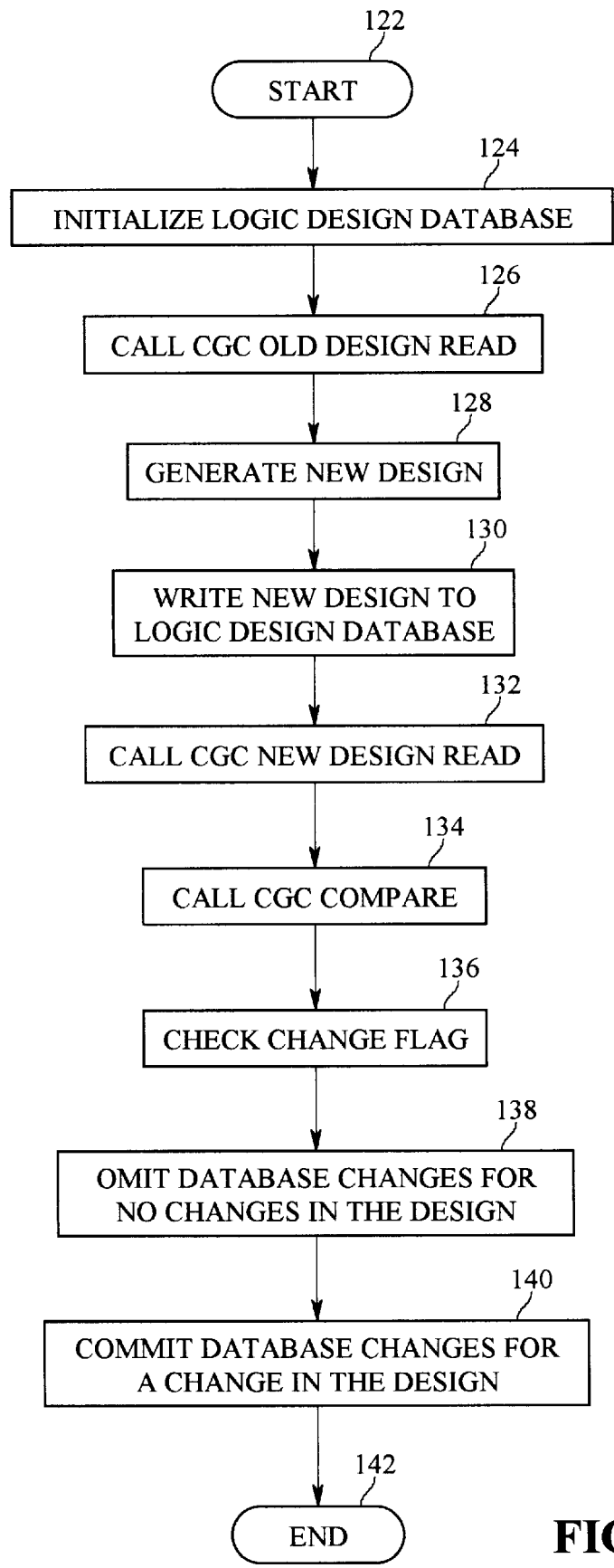
FIG. 8 is a flow chart illustrating the steps taken by the Compiler/EDIF Reader during Cone Graph Compare processing.

FIG. 8 is a flow chart illustrating the steps taken by the Compiler/EDIF Reader during Cone Graph Compare processing. After Start Step 122 by either the Compiler 30 or the EDIF Reader 78, the Logic Design Database is initialized at Step 124. Next, the CGC Old Design Read procedure is called at Step 126 to read in the previous design from the Logic Design Database. At Step 128, the new design is generated by the Compiler/EDIF Reader. The new design is written to the Logic Design Database at Step 130. Next, at Step 132, the CGC New Design Read procedure is called to read in the new design from the Logic Design Database. At Step 134, the Cone Graph Compare algorithm is invoked by calling the CGC Compare procedure. After the Cone Graph Compare algorithm is complete, the Compiler/EDIF Reader checks the change flag at Step 136. If the change flag is not set by the Cone Graph Compare algorithm, then potential changes to the Logic Design Database are omitted as no changes are made to the design (Step 138). If the change flag is set by the Cone Graph Compare algorithm, then the design changes are committed to the Logic Design Database (Step 140). Compiler/EDIF Reader processing ends at End Step 142.

FIG. 9A is a flow chart illustrating the steps of the Cone Graph Compare Old Design Read process. The CGC Old Design Read procedure reads in the old design from the Logic Design Database. After Start Step 144, internal tables are constructed to store the old (i.e., previous) design at Step 146. Processing ends at End Step 148. Similarly, there is a procedure to read in the new design from the database. FIG. 9B is a flow chart illustrating the steps of the Cone Graph Compare New Design Read process. The CGC New Design Read procedure reads in the new design from the Logic Design Database. After Start Step 150, internal tables are constructed to store the new (i.e., current) design at Step 152. Processing ends at End Step 154.

FIG. 9C is a flow chart illustrating the steps of the Cone Graph Compare process. The Compare process establishes a starting point of user-defined nets in the logic design. After Start Step 156, all user-defined nets from the new design are processed at Step 158. This Step is further defined in FIG. 9D. FIG. 9D is a flow chart illustrating the steps for processing user-defined nets. The steps of FIG. 9D provide further details of Step 158 from FIG. 9C. After Start Step 160, the starting apex net is recorded and the name is marked at Step 162. This apex net is a user-defined net. At Step 164, matching user names in the old design are found. If no matching user names are found, a difference message is printed. At Step 166, the matching names in the old design are marked as found. At Step 168, for each bit of a user net name (referring to the apex within the new design), Step 170 is performed by calling the Cone Graph Compare Get Component Driving procedure. After all bits are processed in this manner, processing for user-defined nets ends at End Step 172.

Referring back to FIG. 9C, processing of the Compare steps continues at Step 174. At this step, the "unvisited" components and nets (both old and new design) are processed by assigning new names for component and nets in the new design that have not handled by other procedures within Cone Graph Compare processing. At Step 176, the component and net names are updated in the Logic Design Database. The design change flag is set at Step 178 and Compare processing ends at End Step 180.

Figure 10:
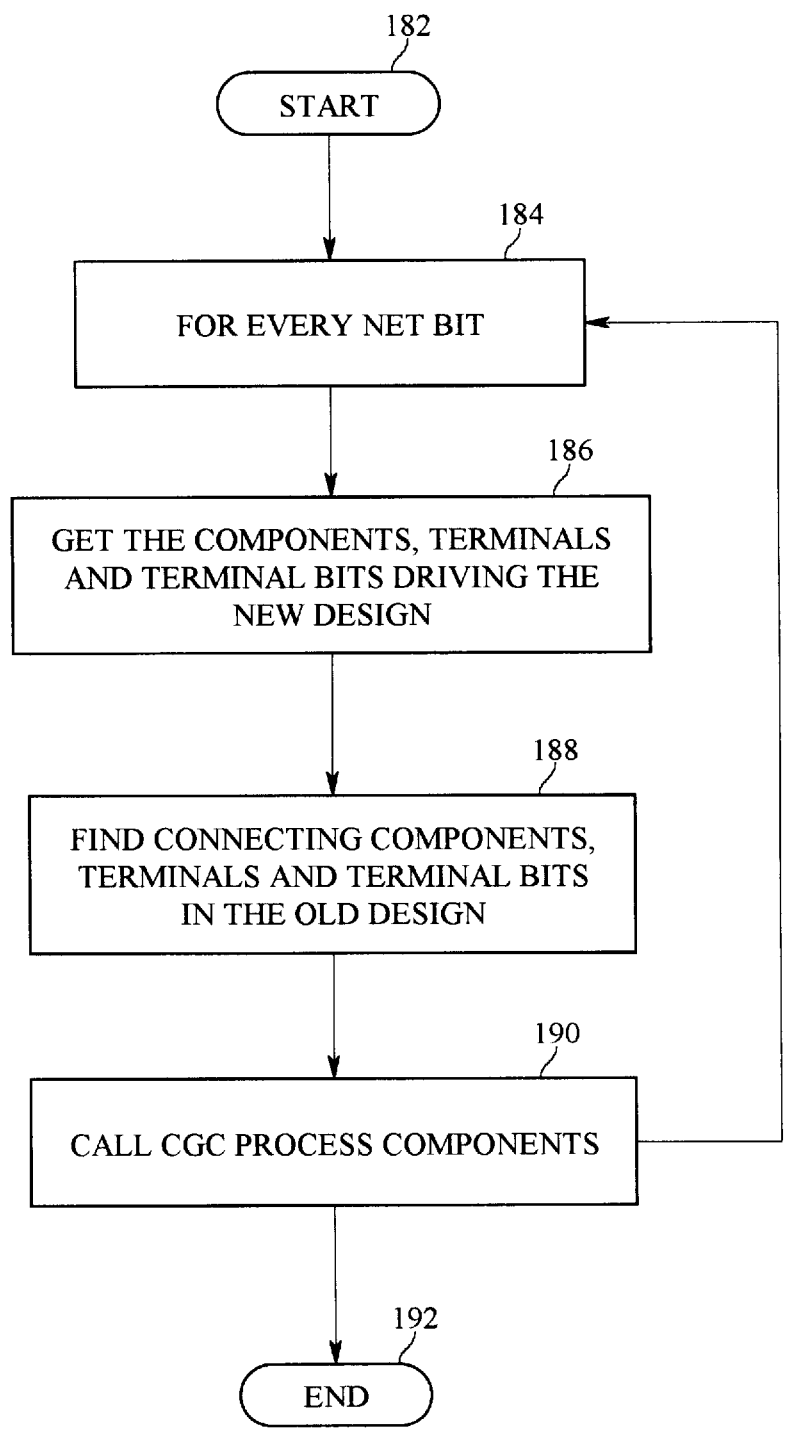
FIG. 10 is a flow chart illustrating the steps for the Cone Graph Compare Get Component Driving process.

FIG. 10 is a flow chart illustrating the steps for the Cone Graph Compare Get Component Driving process. This process was called at Step 170 of FIG. 9D. After Start Step 182, a processing loop is performed for every net bit (Step 184). At Step 186, the components, terminals, and terminal bits which drive the new design are identified. At Step 188, the connecting components, terminals, and terminal bits in the old design are found. The CGC Process Components process is then called at Step 190. These three steps are repeated for each net bit. Processing ends at End Step 192.

Figure 11:
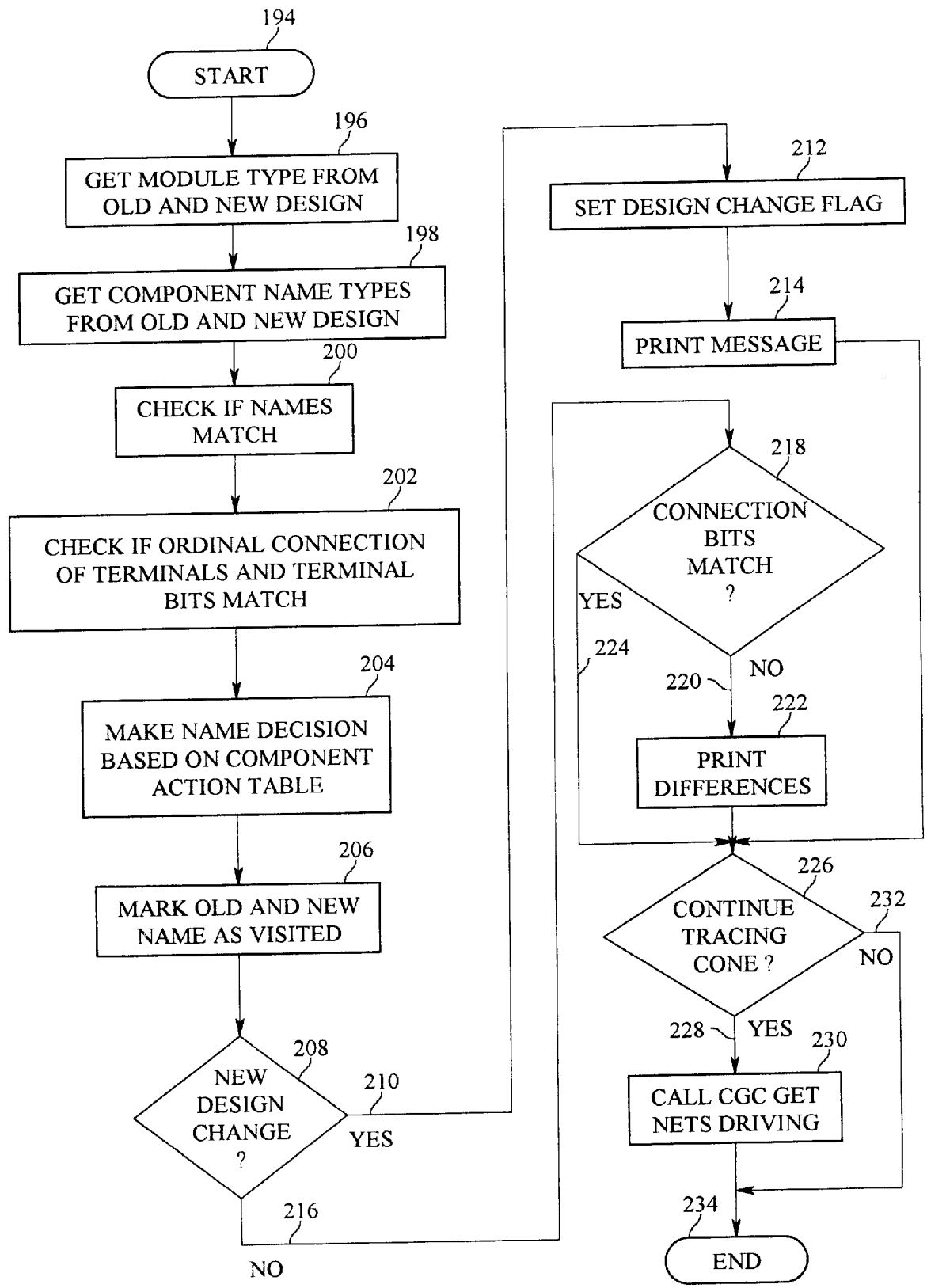
FIG. 11 is a flow chart illustrating the steps for processing components.

FIG. 11 is a flow chart illustrating the steps for processing components. The CGC Process Components procedure starts at Start Step 194. The module type from the old and new design is obtained at Step 196. Next, at Step 198, component name types are obtained from the old and the new design. The old and new names are compared at Step 200. The ordinal connection of terminals and terminals bits for the old and new designs are compared at Step 202. A name decision is then made at Step 204, based on the Component Action Table. There are three possible actions. The first action is to map the old component name to the new component name. The second action is to put the new component name on a list for later assignment. The third action is to ignore the component name. If the current component name has been previously processed, then CGC Process Components processing is halted.

FIG. 12 is a diagram showing the Component Action Table. The Component Action Table defines the action taken when comparing an old component name with a new component name during Cone Graph Compare processing. The Table is a convenient way to show the many possible combinations of name types. New component name types are listed in the top row of the Table. Old component name types are listed in the left-most column of the Table. Each entry in the Table is divided up into an upper and lower portion. The upper portion of an entry specifies the action to be taken if the corresponding old and new component names are the same. The lower portion of an entry specifies the action to be taken if the corresponding old and new component names are different. There are three fields in each entry portion. The first field specifies whether a change in design structure has taken place. A "NC" value means no change in structure has occurred, so the design change flag stays unchanged. A "SC" value means the design structure has changed and the design change flag is set. The second field specifies whether the Cone Graph Compare processing should continue to trace the current cone of logic. A "CT" value means that tracing of the current cone should continue, while a "DT" value means tracing of the current cone is done. The third field specifies whether the name of the current component should be changed. A "PN" value means the name should be pushed onto a stack so it can be changed at a later point in the processing. A "RN" value means the name should be reassigned (new name:=old name). A "NA" value means that no action is taken for the current name. Blank entries in the Component Action Table indicate that the selected combination will not occur.

For example, refer to the uppermost row and leftmost column of the Table. If a new component name is a user-defined component name and it is the same as the corresponding old user-defined component name, then no change in structure is required, tracing of this cone of logic continues, and no further action for the component is performed. If the names are different, then a structural change has taken place, the design change flag is set, tracing of this cone of logic continues, and no further action for the component is performed. For another example, if the new component name is a "Z" name, and it corresponds to an old user-defined component name, then a structural change has taken place, the design change flag is set, tracing of this cone is considered to be done, and no further action for the component is performed. One skilled in the art can see how the definition of entries in the Component Action Table adequately specify processing steps to be performed for component names.

Referring back to FIG. 11, once the name decision has been made in Step 204, the old and new component names are marked as visited at Step 206. At Test Step 208, if the Component Action Table indicated that a new design change has occurred, then Yes path 210 is taken to Step 212. At this step the design change flag is set. At Step 214 a message to that effect is printed for tracking by the logic designer. If at Test Step 208 no new design change was indicated, then No path 216 is taken to Test Step 218. If the connection bits of modules or module types did not match, then No path 220 is taken to Step 222, where the differences in connections are printed. If the connections match, Yes path 224 is taken to Step 226. At Step 226, if the Component Action Table indicates the tracing of the current cone of logic is to continue, the Yes path 228 is taken to Step 230. If no tracing is to continue, then No path 232 is taken to the End Step 234. At Step 230, a call is made to the CGC Get Nets Driving process. CGC Process Components processing ends at End Step 234.

Figure 13:
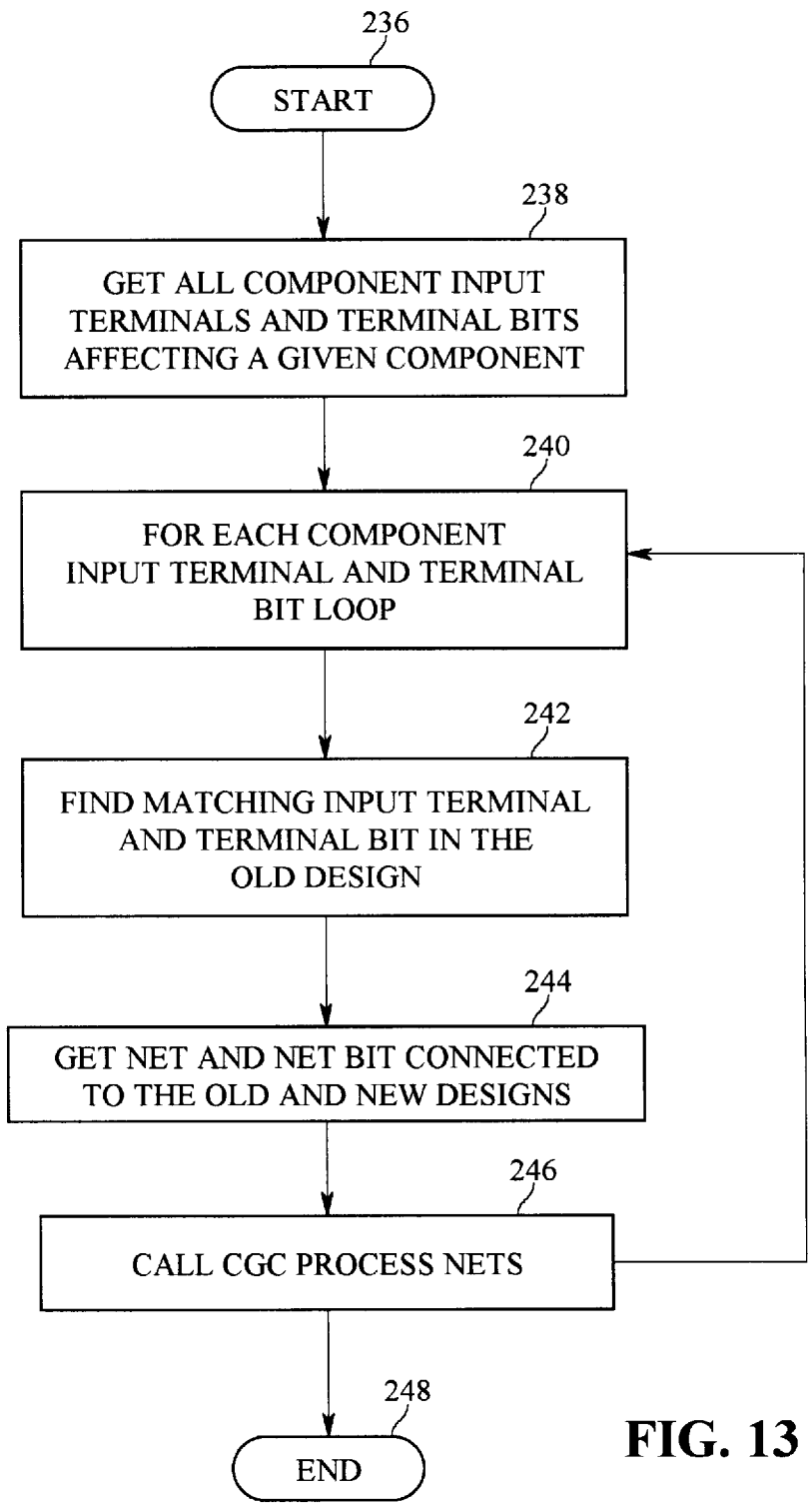
FIG. 13 is a flow chart illustrating the steps for the Cone Graph Compare Get Nets Driving process.

FIG. 13 is a flow chart illustrating the steps for the Cone Graph Compare Get Nets Driving process. This processing takes two inputs, an old component name and a new component name. After Start Step 236, all component input terminals and terminal bits affecting a given component are obtained at Step 238. For each component input terminal and terminal bit (Step 240) loop through the following three steps. At Step 242, the input terminal and terminal bit from the old design matching the new design are found. At Step 244, the net and net bit connected to the old design and the new design are obtained. At Step 246, a call is made to the Cone Graph Compare Process Nets procedure. After all component input terminals and terminal bits have been processed, Get Nets Driving processing ends at End Step 248.

Figure 14:
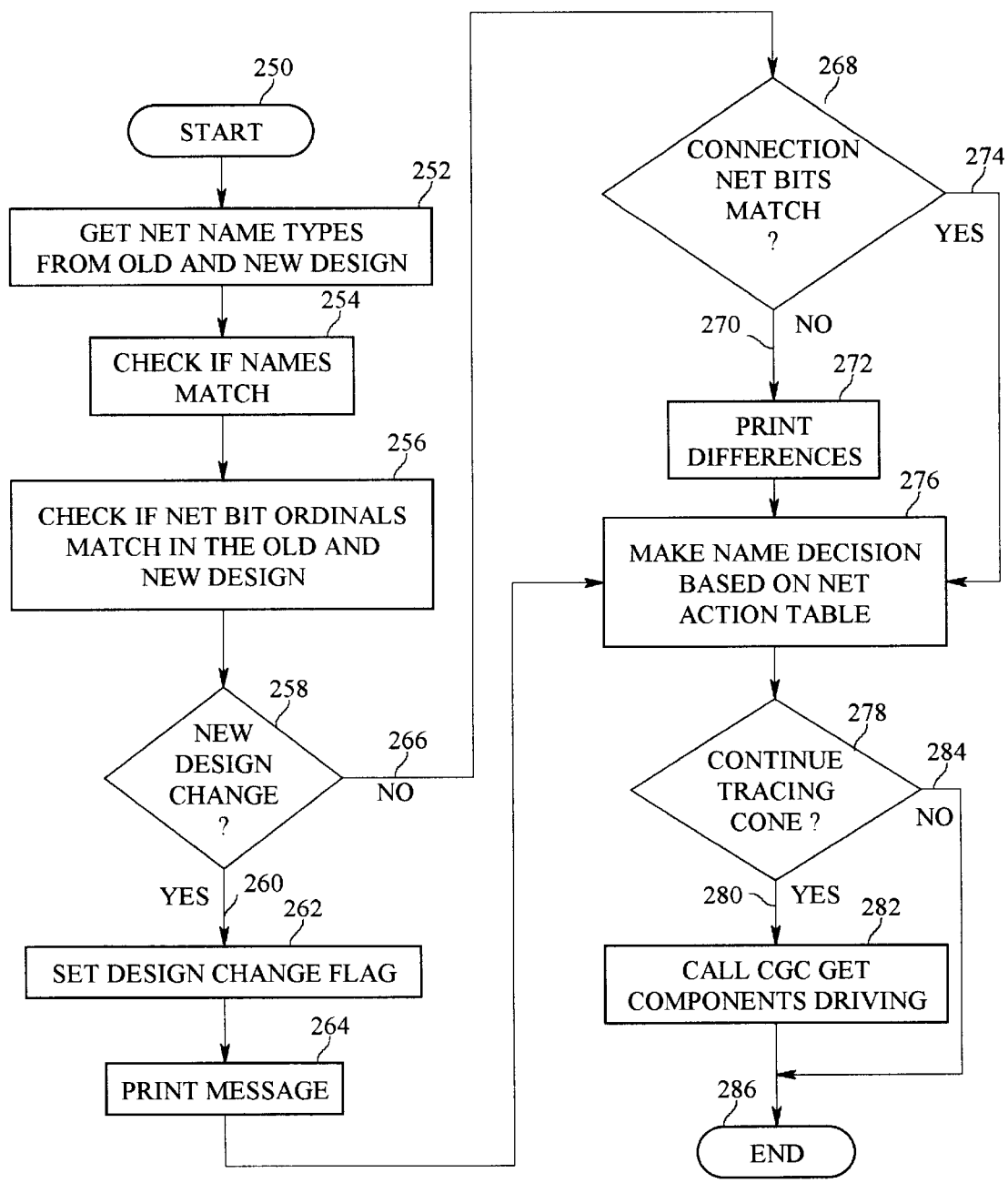
FIG. 14 is a flow chart illustrating the steps for processing nets.

FIG. 14 is a flow chart illustrating the steps for processing nets. The CGC Process Nets procedure starts at Start Step 250. Next, at Step 252, net name types are obtained from the old and the new design. The old and new net names are compared at Step 254. The net bit ordinals for the old and new designs are compared at Step 256. At Test Step 258, if the Net Action Table indicated that a new design change has occurred, then Yes path 260 is taken to Step 262. At this step the design change flag is set. At Step 264 a message to that effect is printed for tracking by the logic designer. If at Test Step 258 no new design change was indicated, then No path 266 is taken to Test Step 268. If the connection net bits do not match, then No path 270 is taken to Step 272, where the differences in connections are printed. If the connections match, Yes path 274 is taken to Step 276.

A name decision is then made at Step 276, based on the Net Action Table. There are three possible actions. The first action is to map the old net name to the new net name. The second action is to put the new net name on a list for later assignment. The third action is to ignore the net name. At Test Step 278, if the Net Action Table indicates the tracing of the current cone of logic is to continue, then Yes path 280 is taken to Step 282. At this step, a call is made to the CGC Get Components Driving process. Note the recursive nature of this processing. If tracing is considered to be done, then No path 284 is taken. CGC Process Nets processing ends at End Step 286.

FIG. 15 is a diagram showing the Net Action Table. The Net Action Table defines the action taken when comparing an old net name with a new net name during Cone Graph Compare processing. The Net Action Table is analogous to the Component Action Table, but it specifies actions to be taken when processing nets. The Table is a convenient way to show the many possible combinations of name types. New net name types are listed in the top row of the Table. Old net name types are listed in the left-most column of the Table. Each entry in the Table is divided up into an upper and lower portion. The upper portion of an entry specifies the action to be taken if the corresponding old and new net names are the same. The lower portion of an entry specifies the action to be taken if the corresponding old and new net names are different. There are three fields in each entry portion. The first field specifies whether a change in design structure has taken place. A "NC" value means no change in structure has occurred, so the design change flag stays unchanged. A "SC" value means the design structure has changed and the design change flag is set. The second field specifies whether the Cone Graph Compare processing should continue to trace the current cone of logic. A "CT" value means that tracing of the current cone should continue, while a "DT" value means tracing of the current cone is done. The third field specifies whether the name of the current net should be changed. A "PN" value means the name should be pushed onto a stack so it can be changed at a later point in the processing. A "RN" value means the name should be reassigned (new name:=old name). A "NA" value means that no action is taken for the current name. Blank entries in the Net Action Table indicate that the selected combination will not occur.

Figure 16:
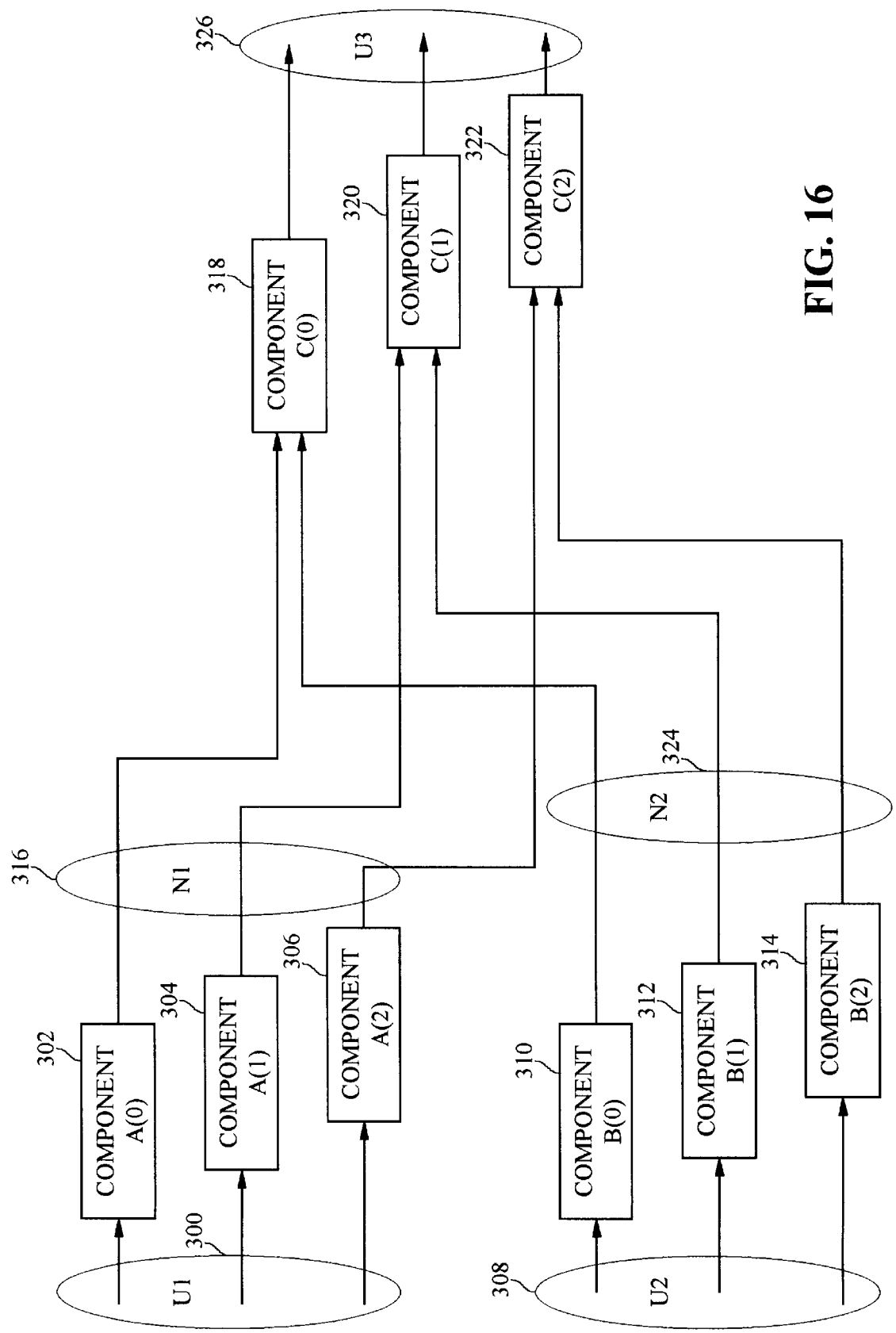
FIG. 16 through FIG. 20 are diagrams of examples used to explain Cone Graph Compare processing.

FIG. 16 through FIG. 20 are diagrams of examples used to explain the Cone Graph Compare processing. FIG. 16 is a diagram of an original design fragment. FIG. 17 through FIG. 20 show the results of CGC processing. In these Figures, user-defined net names are designated by the "U" prefix.ABets are shown as ovals. The original defined net names are designated as "N1" and "N2". The original defined component names are designated as "A(n)", "B(n)", and "C(n)". Components are shown as rectangles. Results of a change in the original design for new component logic names are defined as "A", "Y", "W", and "Z(n)", while new net names are "NZ", "NY", and "NW".

FIG. 16 is a diagram of an original design fragment. User net U1 300 is connected to components A(0) 302, A(1) 304, and A(2) 306, and User net U2 308 is connected to components B(0) 310, B(1) 312, and B(2) 314. The output lines from A(0) 302, A(1) 304, and A(2) 306 are denoted "N1" 316. They connect A(0), A(1), and A(2) to components C(0) 318, C(1) 320, and C(2) 322, respectively. The output lines from B(0) 310, B(1) 312, and B(2) 314 are denoted "N2" 324. They connect B(0), B(1), and B(2) to C(0), C(1), and C(2), respectively. User net U3 326 is output from components C(0), C(1), and C(2).

Figure 17:
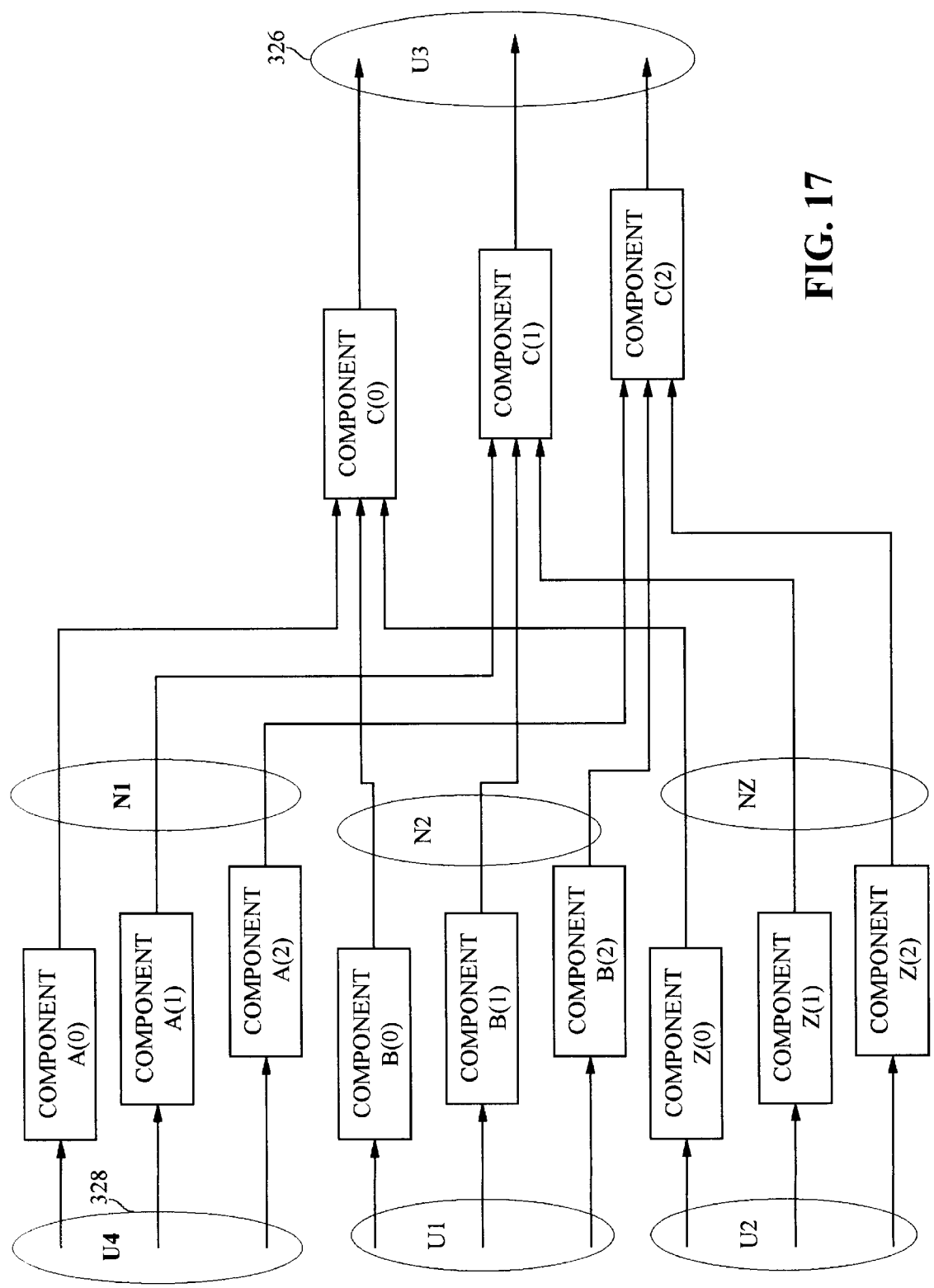

FIG. 17 is a diagram showing new logic added to the original design fragment of FIG. 16. The input lines for this new logic are given a name of "U4" 328 by the user. This example illustrates a change in the topological view from the apex of the logic design cone back to the root of the logic design cone. Cone Graph Compare processing transfers the names from the original (i.e., previous) design version to the modified (i.e., current) design version, wherever applicable. Thus, the names for the previous design cone of logic "U3" 326 to "U1" are transferred to the current design cone of logic "U3" 326 to "U4" 328. The names from the previous design cone of logic "U3" to "U2" are transferred to the current design cone of logic "U3" to "U1". Components in the current design cone of logic "U3" to "U2" are assigned completely new names. (e.g., "Z(n)" and "NZ").

Figure 18:
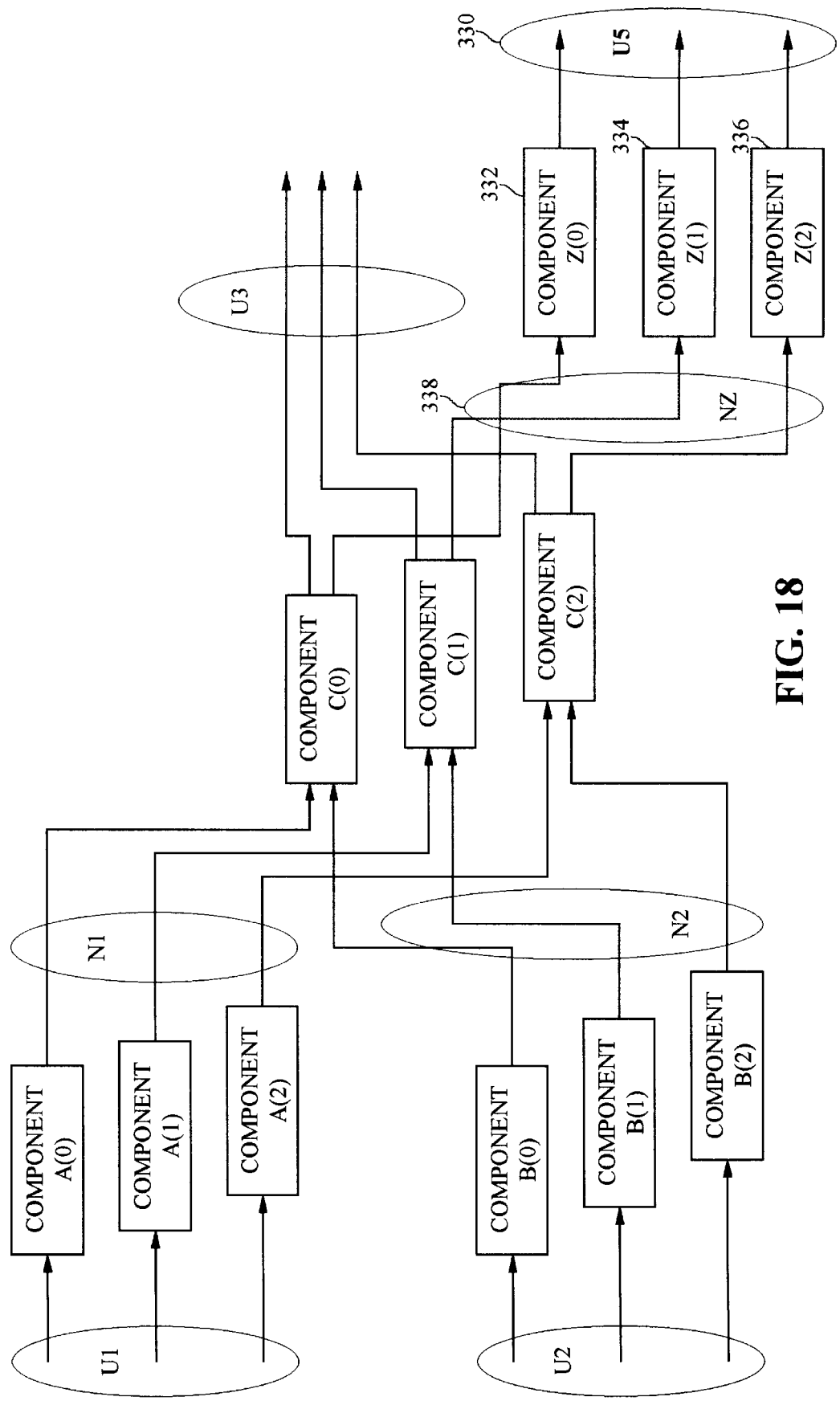

FIG. 18 is a diagram showing another set of new logic added to the original design fragment of FIG. 16. The output lines for this set of logic were named "U5" 330 by the user. This example illustrates a change in the topological view, now consisting of two apexes of logic design cones back to a common root of the logic design cones. Cone Graph Processing transfers the names from the original design version to the modified design version, where applicable. Thus, the names for the previous design cone of logic "U3" to "U1" transfers to the current design cone of logic "U3" to "U1". The names for the previous design cone of logic "U3" to "U2" transfers to the current design cone of logic "U3" to "U2". Components of the current design cone of logic "U5" to "U1" & "U2" are assigned new names (e.g., "Z(0)" 332, "Z(1)" 334, and "Z(2)" 336 and "NZ" 338).

Figure 19:
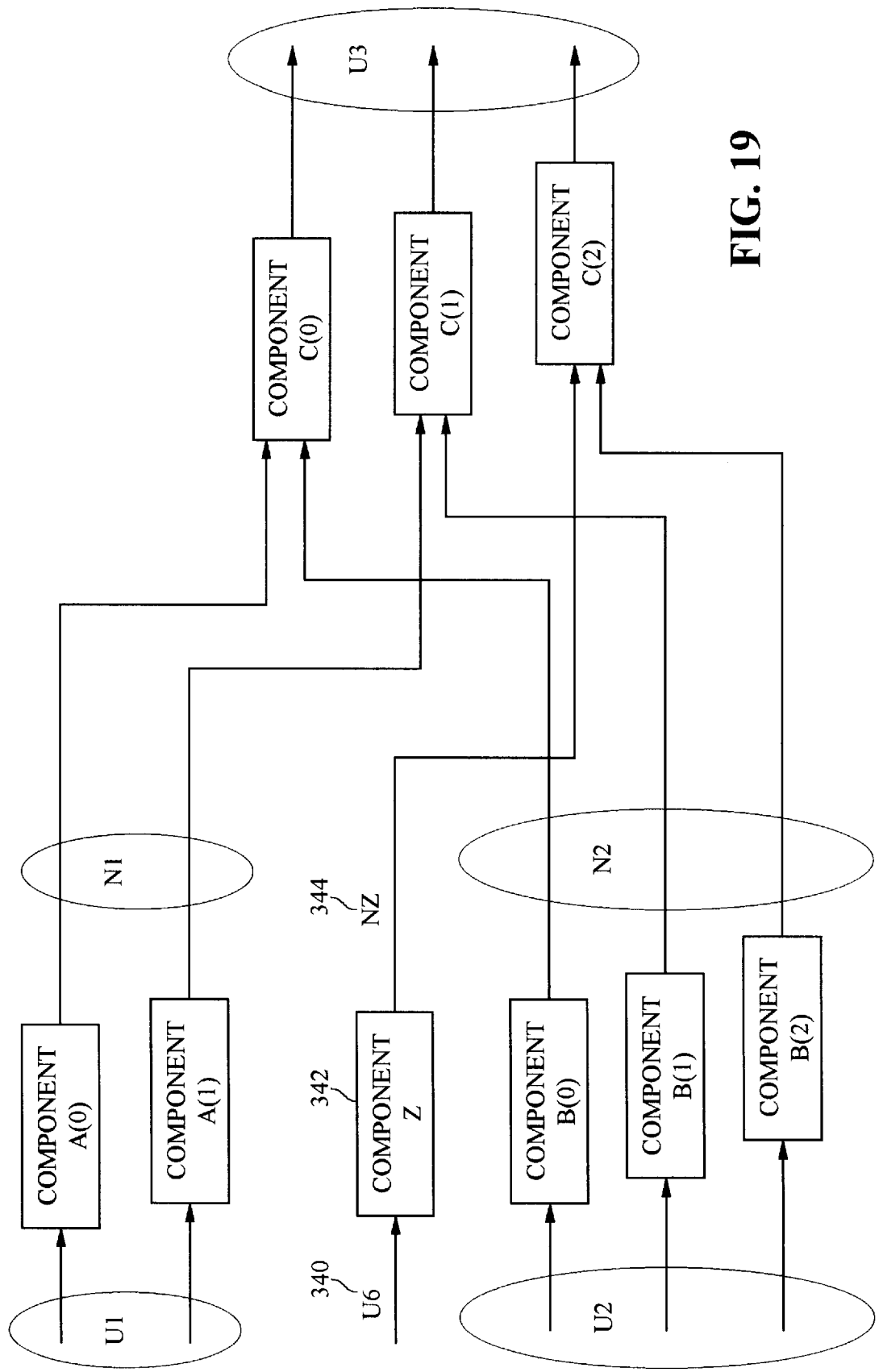

FIG. 19 is a diagram showing another set of new logic added to the original design fragment of FIG. 16. A new component connected to input line "U6" 340 was added, and a component and net were deleted from "A(n)" and "N1". This example illustrates a change in the topological view, now consisting of the same apex of logic design cone back to different roots. Cone Graph Compare processing transfers the names from the original design version to the modified design version, where applicable. Thus, the names for the previous design cone of logic "U3" to "U1" transfers to the current design cone "U3" to "U1" for the current two components "A(0)" and "A(1)" and nets "N1(0)" and "N1(1)". The names for the previous design cone of logic "U3" to "U2" transfer to the current design cone of logic "U3" to "U2". The change in the current design cone of logic "U3" to "U6" results in new names being assigned for component "Z" 342 and net "NZ" 344. Note the component ordinality causes A(0), A(1), B(0), B(1), and B(2) to be traced first, which implies that N1 and N2 were processed before the first input to component C(2) (which was the new logic).

Figure 20:
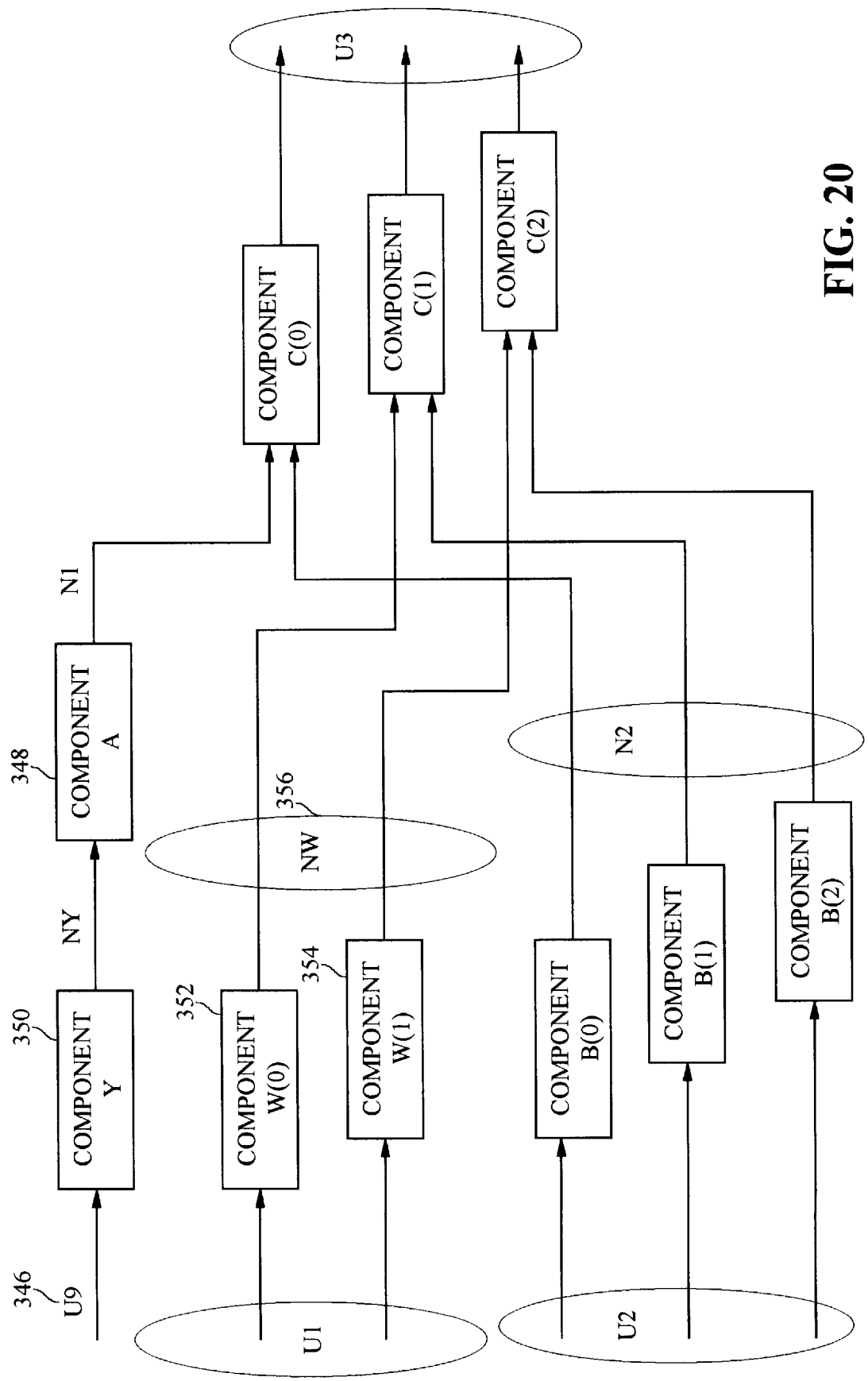

FIG. 20 is a diagram showing another set of new logic added to the original design fragment of FIG. 16. A new component connected to input line "U9" 346 was added, and a component and net were deleted from "A(n)" and "N1". This example illustrates a change in the topological view, now consisting of the same apex of logic design cone back to different roots. Cone Graph Compare processing transfers the names from the original design version to the modified design version, where applicable. Thus, the names for the previous design cone of logic "U3" to "U1" transfers to the current design cone of logic "U3" to "U9". Note that the name for the component stack ("A(n)") has been assigned to the individual component of the current version and a new name is assigned to the preceding component ("Y") 350. The names from the previous design cone of logic "U3" to "U2" transfer to the current design cone of logic "U3" to "U2". Components in the current design cone of logic "U3" to "U1" are assigned new names (e.g., "W(0)" 352, "W(1)" 354, and "NW" 356).

The present invention allows computer-generated component and net names to be carried forward from one design version to the next. This name stabilization prevents post-synthesis EDA tools from making unnecessary placement and routing changes, and aids circuit designers in stabilizing floor plans. This feature is made possible by the very efficient Cone Graph Compare process, which operates on logic cones rather than on an entire design. Thus, incremental design changes do not result in unnecessary modifications to placement and routing information because of name changes. Therefore, large amounts of time are saved in the design and test cycle for integrated circuits because the results (especially physical attribute assignments) of previous design versions can be reused.

The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended Claims.

We claim:

1. In a system used by a logic designer for designing a circuit, the system including a computerized database for storing a detailed description of the circuit design, the detailed description including names for components and nets of the circuit, a method of stabilizing component and net names from a previous detailed description of the circuit design version to a current detailed description of the circuit design version comprising the steps of:

(a) partitioning the previous detailed description of the circuit design version into a first plurality of groups of logic design, each of said first plurality of groups including a section of the previous detailed description of the circuit design version defined by a path from at least one logic designer-defined previous net to at least one logic designer-defined base net affecting said logic designer-defined previous net;

(b) partitioning the current detailed description of the circuit design version into a second plurality of groups of logic design, each of said second plurality of groups including a section of the current detailed description of the circuit design version defined by a path from at least one logic designer-defined current net to at least one logic designer-defined base net affecting said logic designer-defined current net;

(c) selecting a first group from said first plurality of groups and a second group from said second plurality of groups;

(d) transferring the component and net names of said first selected group to said second selected group when said first selected group and said second selected group have an identical logical structure;

(e) performing the following steps when said first selected group and said second selected group do not have identical logical structure:

(e1) transferring the component and net names from said first selected group to said second selected group for all subsections of said first selected group which have an identical logical structure to corresponding subsections of said second selected group; and (e2) assigning new component and net names for those subsections of said second selected group that do not exist in said first selected group; and (f) repeating steps (c) through (e) for said first plurality and said second plurality of groups.

2. In an electronic design automation system used by a logic designer for designing an integrated circuit, the electronic design automation system including a computerized circuit design database for storing a gate level description of the integrated circuit design, the gate level description including names for components and nets of the integrated circuit, the gate level description being capable of being divided into cones of logic design wherein each of the cones includes base nets that are input to the cone and and apex nets which are output from the cone, a method of stabilizing component and net names from a previous integrated circuit design version to a current integrated circuit design version comprising the steps of:

(a) electronically reading the previous integrated circuit design version from the computerized circuit design database;

(b) electronically reading the current integrated circuit design version from the computerized circuit design database;

(c) partitioning the previous integrated circuit design version into a first plurality of the cones of logic design, each of said first plurality of the cones of logic design including a section of the previous integrated circuit design version defined by a path from at least one logic designer-defined apex net to at least one logic designer-defined base net wherein the logic level of said logic designer-defined base net is capable of affecting the logic level of said logic designer-defined apex net;

(d) partitioning the current integrated circuit design version into a second plurality of the cones of logic design, each of said second plurality of the cones of logic design including a section of the current integrated circuit design version defined by a path from at least one logic designer-defined apex net to at least one logic designer-defined base net wherein the logic level of said logic designer-defined base net is capable of affecting the logic level of said logic designer-defined apex net;

(e) selecting a first cone of logic design from said first plurality of the cones of logic design and a second cone of logic design from said second plurality of the cones of logic design;

(f) transferring the component and net names of said first selected cone of logic design to said second selected cone of logic design when said first selected cone of logic design and said second selected cone of logic design have identical logical structure;

(g) performing the following steps when said first selected cone of logic design and said second selected cone of logic design do not have identical logical structure:

(g1) transferring the component and net names from said first selected cone of logic design to said second selected cone of logic design for all subsections of said first selected cone of logic design which have identical logical structure to corresponding subsections of said second selected cone of logic design; and (g2) assigning new component and net names for those subsections of said second selected cone of logic design that do not exist in said first selected cone of logic design;

(h) repeating steps (e) through (g) for said first plurality and said second plurality of separate cones of logic design; and (i) storing said current integrated circuit design version into the computerized circuit design database.

3. In an electronic design automation system used by a logic designer for designing an integrated circuit, the electronic design automation system including a computerized circuit design database for storing a gate level description of the integrated circuit design, the gate level description including names for components and nets of the integrated circuit, a method of stabilizing component and net names from a previous integrated circuit design version to a current integrated circuit design version comprising the steps of:

(a) electronically reading the previous integrated circuit design version from the computerized circuit design database;

(b) electronically reading the current integrated circuit design version from the computerized circuit design database;

(c) comparing the previous integrated circuit design version with the current integrated circuit design version and updating component and net names of the current integrated circuit design version, wherein said comparing step includes the steps of (c1) dividing the current integrated circuit into partitions having at least one logic designer-defined apex net, one or more logic designer-defined base nets wherein the logic level of each of said base nets is capable of affecting the logic level of said at least one logic designer-defined apex net, and all components and nets existing in the paths connecting said at least one logic designer-defined apex net and said one or more logic designer-defined base nets;

(c2) selecting one of said partitions as a current partition;

(c3) assigning names of selected components and nets from the previous integrated circuit design to selected ones of the components and nets, respectively, within said current partition, said selected components and nets from the previous integrated circuit design having a similar interconnecting structure to the interconnecting structure of said selected components and nets from said current partition;

(c4) updating all names of remaining components and nets remaining in said current partition that were not assigned in step (c3) by assigning new names for said remaining components and nets;

(c5) storing all component and net names for said current partition in the computerized circuit design database; and (c6) repeating steps (c2) through (c5) for all of said partitions.

4. A system for stabilizing component and net names from a previous circuit design version to a current circuit design version, the system including a computerized database for storing a detailed description of the circuit design, the detailed description including names for components and nets of the circuit, nets of the circuit including first nets input to the circuit and second nets output from the circuit, the first nets and the second nets being named by a logic designer, comprising:

partitioning means for partitioning the detailed description of the previous circuit design version into a first plurality of groups of logic design, each of said first plurality of groups including a first section of the previous circuit design version defined by a first path from at least one logic designer-defined first net to at least one logic designer-defined second net affecting said logic designer-defined first net, and for partitioning the detailed description of the current circuit design version into a second plurality of groups, each of said second plurality of groups including a second section of the current circuit design version defined by a second path from at least one logic designer-defined first net to at least one logic designer-defined second net affecting said logic designer-defined first net;

selecting means coupled to said partitioning means for selecting a first group from said first plurality of groups and for selecting a second group from said second plurality of groups;

first transferring means for transferring the component and net names of said first selected group to said second selected group when said first selected group and said second selected group have identical logical structure;

second transferring means for transferring the component and net names from said first selected group to said second selected group for all subsections of said first selected group which have identical logical structure to corresponding subsections of said second selected group, when said first selected group and said second selected group do not have identical structure; and means for assigning new component and net names for those subsections of said second selected group that do not exist in said first selected group, when said first selected group and said second selected group do not have identical structure.

5. An electronic design automation system used by a logic designer for designing an integrated circuit, the electronic design automation system including a computerized circuit design database for storing a gate level description of the integrated circuit design, the gate level description including names for components and nets of the integrated circuit, the electronic design automation system comprising:

a processor for processing electronic circuit designs;

a storage device coupled to said processor for storing the computerized circuit design database; and software means operative on said processor for stabilizing component and net names from a previous integrated circuit design version to a current integrated circuit design version by said software means including means for:

(a) electronically reading the gate level description of the previous integrated circuit design version from the computerized circuit design database;

(b) electronically reading the gate level description of the current integrated circuit design version from the computerized circuit design database;

(c) partitioning the previous integrated circuit design version into a first plurality of separate cones of logic design, each of said first plurality of separate cones of logic design including a section of the previous integrated circuit design version defined by a path from at least one previous logic designer-defined apex net to at least one previous logic designer-defined base net wherein the logic level of said at least one previous logic designer-defined base net is capable of affecting the logic level of said at least one previous logic designer-defined apex net;

(d) partitioning the current integrated circuit design version into a second plurality of separate cones of logic design, each of said second plurality of separate cones of logic design including a section of the current integrated circuit design version defined by a path from at least one current logic designer-defined apex net to at least one current logic designer-defined base net wherein the logic level of said at least one current logic designer-defined base net is capable of affecting the logic level of said at least one current logic designer-defined apex net;

(e) selecting a first cone of logic design from said first plurality of separate cones of logic design and a second cone of logic design from said second plurality of separate cones of logic design;

(f) transferring the component and net names of said first selected cone of logic design to said second selected cone of logic design when said first selected cone of logic design and said second selected cone of logic design have identical logical structure;

(g) performing the following steps when said first selected cone of logic design and said second selected cone of logic design do not have identical logical structure:

(g1) transferring the component and net names from said first selected cone of logic design to said second selected cone of logic design for all subsections of said first selected cone of logic design which have identical logical structure to corresponding subsections of said second selected cone of logic design; and (g2) assigning new component and net names for those subsections of said second selected cone of logic design that do not exist in said first selected cone of logic design;

(h) repeating steps (e) through (g) for said first plurality and said second plurality of separate cones of logic design; and (i) storing said current integrated circuit design version into the computerized circuit design database.

6. An electronic design automation system used by a logic designer for stabilizing component and net names from a previous application specific integrated circuit (ASIC) design version to a current ASIC design version during multiple design iterations for an ASIC, comprising:

a computerized ASIC design database for storing a gate level description of the ASIC design, said gate level description including names for components and nets of the ASIC, nets of the ASIC including base nets input to the ASIC and apex nets output from the ASIC;

means for reading the previous ASIC design version and the current ASIC design version from the computerized ASIC database;

first partitioning means coupled to the computerized ASIC design database for partitioning the previous ASIC design version into a first plurality of separate cones of logic design, each of said first plurality of separate cones of logic design including a section of the previous ASIC design version defined by a path from at least one logic designer-defined apex net to at least one logic designer-defined base net affecting said logic designer-defined apex net;

second partitioning means coupled to the computerized ASIC design database for partitioning the current ASIC design version into a second plurality of separate cones of logic design, each of said second plurality of separate cones of logic design including a section of the current ASIC design version defined by a path from at least one logic designer-defined apex net to at least one logic designer-defined base net affecting said logic designer-defined apex net;

selecting means coupled to said first partitioning means and said second partitioning means for selecting a first cone of logic design from said first plurality of cones of logic design and for selecting a second cone of logic design from said second plurality of cones of logic design;

first transfer means for transferring the component and net names of said first selected cone of logic design to said second selected cone of logic design when said first selected cone of logic design and said second selected cone of logic design have identical logical structure;

second transfer means for transferring the component and net names from said first selected cone of logic design to said second selected cone of logic design for all subsections of said first selected cone of logic design which have identical logical structure to corresponding subsections of said second selected cone of logic design, when said first selected cone of logic design and said second selected cone of logic design do not have identical structure;

means for assigning new component and net names for those subsections of said second selected cone of logic design that do not exist in said first selected cone of logic design, when said first selected cone of logic design and said second selected cone of logic design do not have identical structure; and means for storing the current ASIC design version into said computerized ASIC design database.

7. In a system used by a logic designer for designing a circuit, the system including a computerized database for storing a gate-level circuit design including nets having net names and components having component names, predetermined ones of the component and net names being designer-assigned names assigned by the logic designer and other predetermined ones of the component and net names being automatically-assigned names that are automatically assigned by the system when the detailed description of the circuit design is generated, a method of copying the automatically-assigned names from a previous version of the gate-level circuit design to a current version of the gate-level circuit design, the method comprising the steps of:

(a) partitioning the previous version of the gate-level circuit design into a plurality of first logic groups, each of said first logic groups including at least one net having a designer-assigned name and at least one net or component having an automatically-assigned name;

(b) partitioning the current version of the gate-level circuit design into a plurality of second logic groups, each of said second logic groups including at least one net having a designer-assigned name and at least one net or component having an automatically-assigned name;

(c) selecting a selected group from said plurality of second logic groups;

(d) locating a corresponding one of said first logic groups that has at least one net having a designer-assigned name that corresponds to a designer-assigned name of a net in said selected group;

(e) transferring the automatically-assigned component and net names from components and nets, respectively, in said corresponding one of said first logic groups to components and nets, respectively, in said selected group for all components and nets in said selected group that have a corresponding component and net, respectively, in said corresponding one of said first logic groups;

(f) assigning new automatically-assigned component and net names to the components and nets, respectively, in said selected group for all components and nets, respectively, in said selected group that do not have a corresponding component and net in said corresponding one of said first logic groups; and (g) repeating steps (c) through (f) for each of said second logic groups.

8. The method of claim 7 wherein said partitioning step (a) comprises the steps of:

(a1) selecting a first net having a designer-assigned name from the previous version of the gate-level circuit design;

(a2) tracing the components and nets that directly or indirectly drive said first net until one or more second nets having designer-assigned names are located;

(a3) grouping said first net, said one or more second nets, and all nets and components traced in said step a2 into one of said first logic groups; and (a4) repeating said steps a1 through a3 for each of said plurality of first logic groups.

9. The method of claim 7 wherein said partitioning step (b) comprises the steps of:

(b1) selecting a first net having a designer-assigned name from the current version of the gate-level circuit design;

(b2) tracing the components and nets that directly or indirectly drive said first net until one or more second nets having designer-assigned names are located;

(b3) grouping said first net, said one or more second nets, and all nets and components traced in said step b2 into one of said second logic groups; and (b4) repeating said steps b1 through b3 for each of said plurality of second logic groups.

* * * * *